United States Patent [19]

Gordon et al.

[11] Patent Number: 5,148,432
[45] Date of Patent: Sep. 15, 1992

[54] ARRAYED DISK DRIVE SYSTEM AND METHOD

[75] Inventors: David W. Gordon; David C. Stallmo; David M. Warner; William A. Brant, all of Boulder; Walter A. Hubis, Louisville, all of Colo.

[73] Assignee: Array Technology Corporation, Boulder, Colo.

[21] Appl. No.: 758,393

[22] Filed: Sep. 3, 1991

Related U.S. Application Data

[63] Continuation of Ser. No. 270,713, Nov. 14, 1988, abandoned.

[51] Int. Cl.⁵ .............. G06F 11/10; G06F 11/20
[52] U.S. Cl. .............. 371/10.1; 364/243.1; 364/268.5; 364/DIG. 1; 371/11.1
[58] Field of Search .............. 371/10.1, 10.2, 11.1; 364/243.1, 248.1, 268.5, 944, 952.1, 964.7; 395/575

[56] References Cited

U.S. PATENT DOCUMENTS

| | | | |
|---|---|---|---|
| 4,092,732 | 5/1978 | Ouchi | 364/900 |
| 4,761,785 | 8/1988 | Clark et al. | 371/35 |
| 4,817,035 | 3/1989 | Timsit | 364/900 |
| 4,870,643 | 9/1989 | Bultman | 371/11.1 |
| 4,899,342 | 2/1990 | Potter et al. | 371/10.1 |
| 4,914,656 | 4/1990 | Dunphy, Jr. et al. | 371/10.2 |
| 4,993,030 | 2/1991 | Krakauer | 371/40.1 |

FOREIGN PATENT DOCUMENTS 0320107 11/1988 European Pat. Off. .
8910594 11/1989 PCT Int'l Appl. .

OTHER PUBLICATIONS

Compcon '89 Digest of Papers, San Francisco, Calif., Feb. 7, 1989, pp. 143-146; W. E. Meador: "Disk Array Systems".
European Search Report for Appln. No. EP 89311715.
"A Case for Redundant Arrays of Inexpensive Disks (RAID)" by David A. Patterson, et al., Dec. 1987, U. C. Berkley.

Primary Examiner—Charles E. Atkinson
Attorney, Agent, or Firm—Graham & James

[57] ABSTRACT

An arrayed disk drive system for providing memory to a computer, said arrayed system having a plurality of disk drives configured to form an array, said arrayed disk drives accessed by a plurality of channels, each channel accessing a plurality of disk drives, including a means for controlling the logical configuration of the arrayed disk drives to appear to the computer as any conceivable arrangement of disk drives, whereby the arrayed disk drive may appear to the computer as the plurality of disk drives, or as one large disk drive comprised of all the arrayed disk drives, or any combination in between. A means for providing a plurality of levels of redundancy on data read or written by the computer to the arrayed disk drives is provided, as well as means controlled by the controlling means for enabling from none to the plurality of levels of redundancy to operate on data being read or written from the arrayed disk drives.

57 Claims, 13 Drawing Sheets

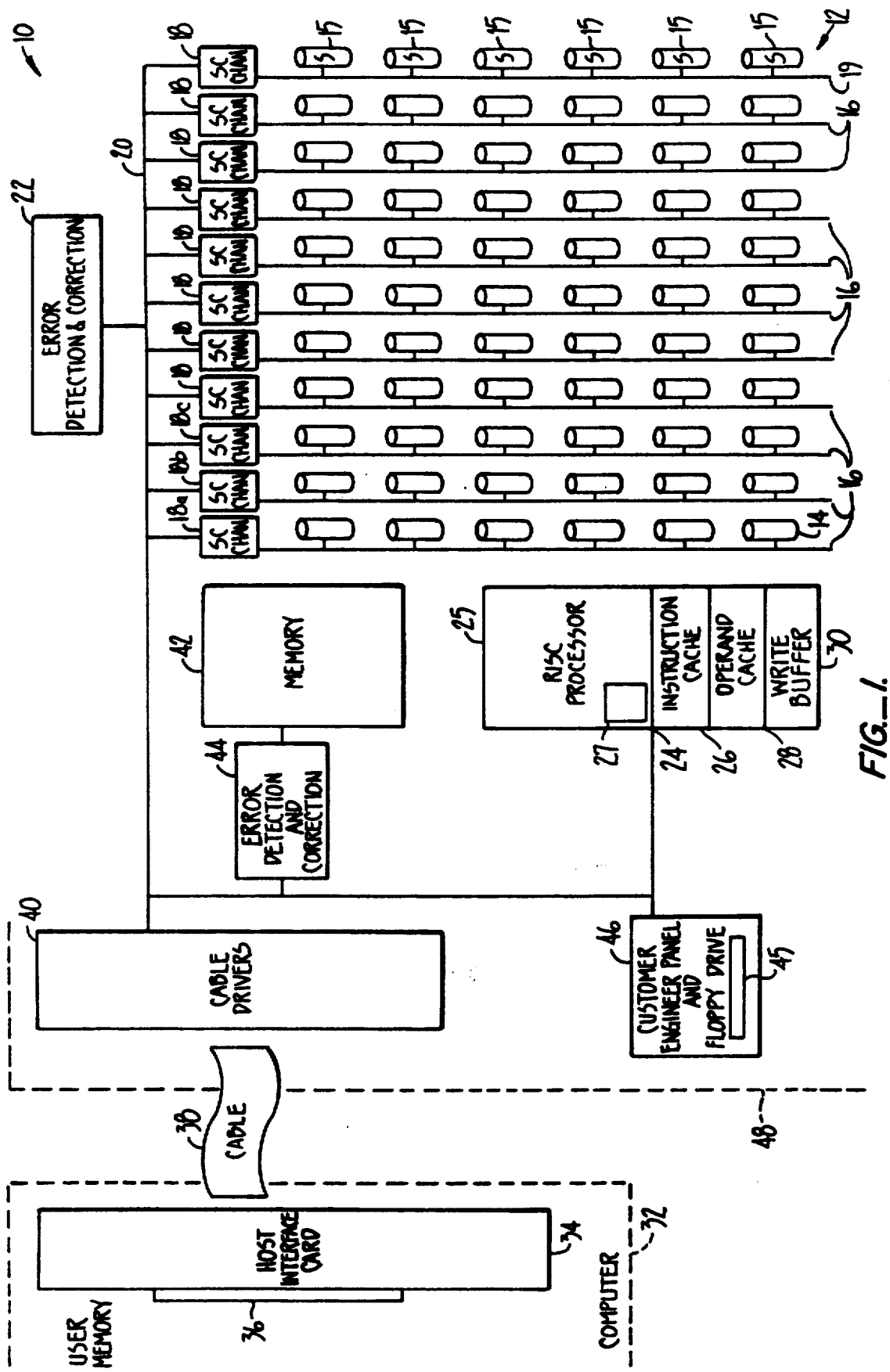
FIG._1.

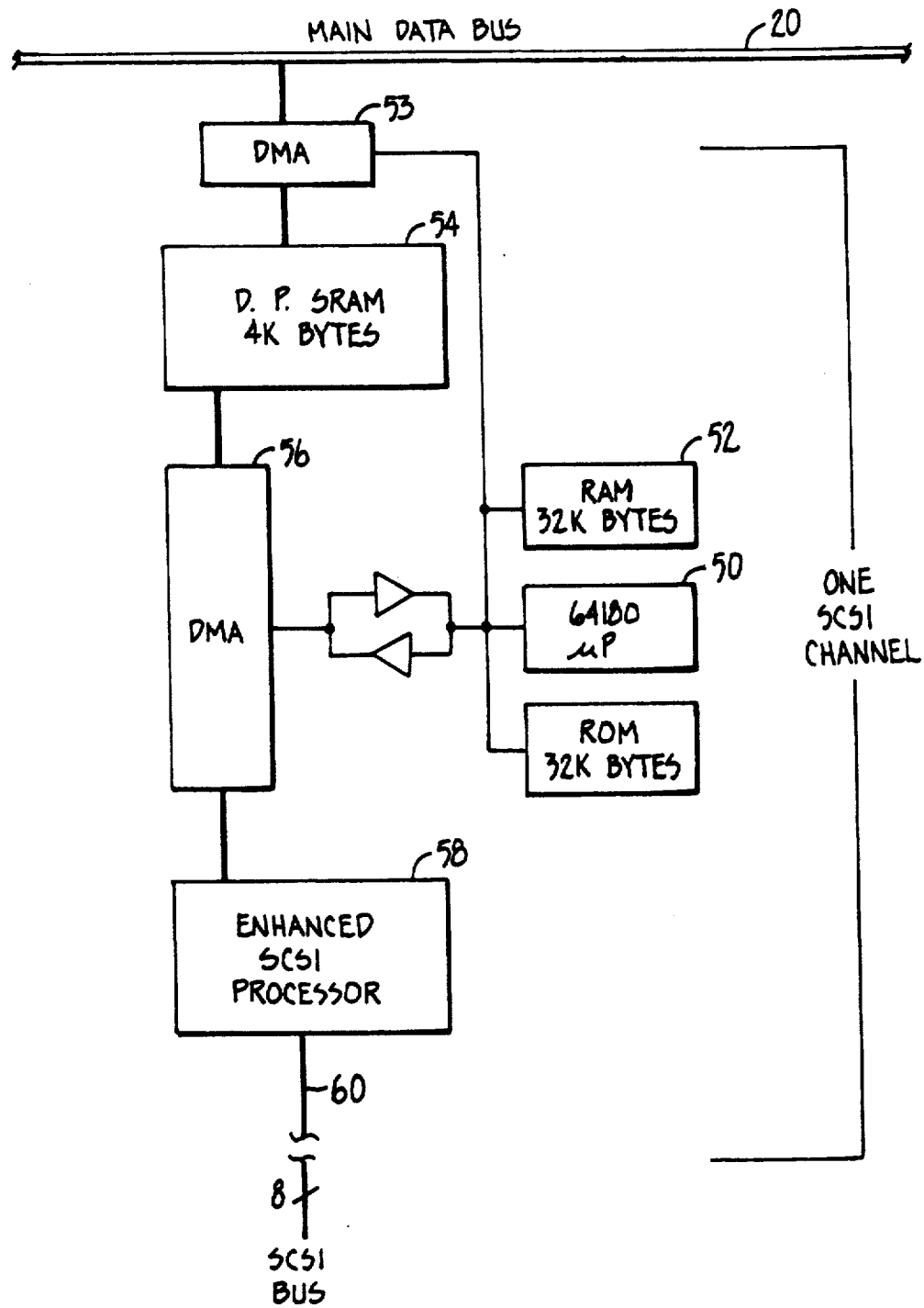
FIG._2.

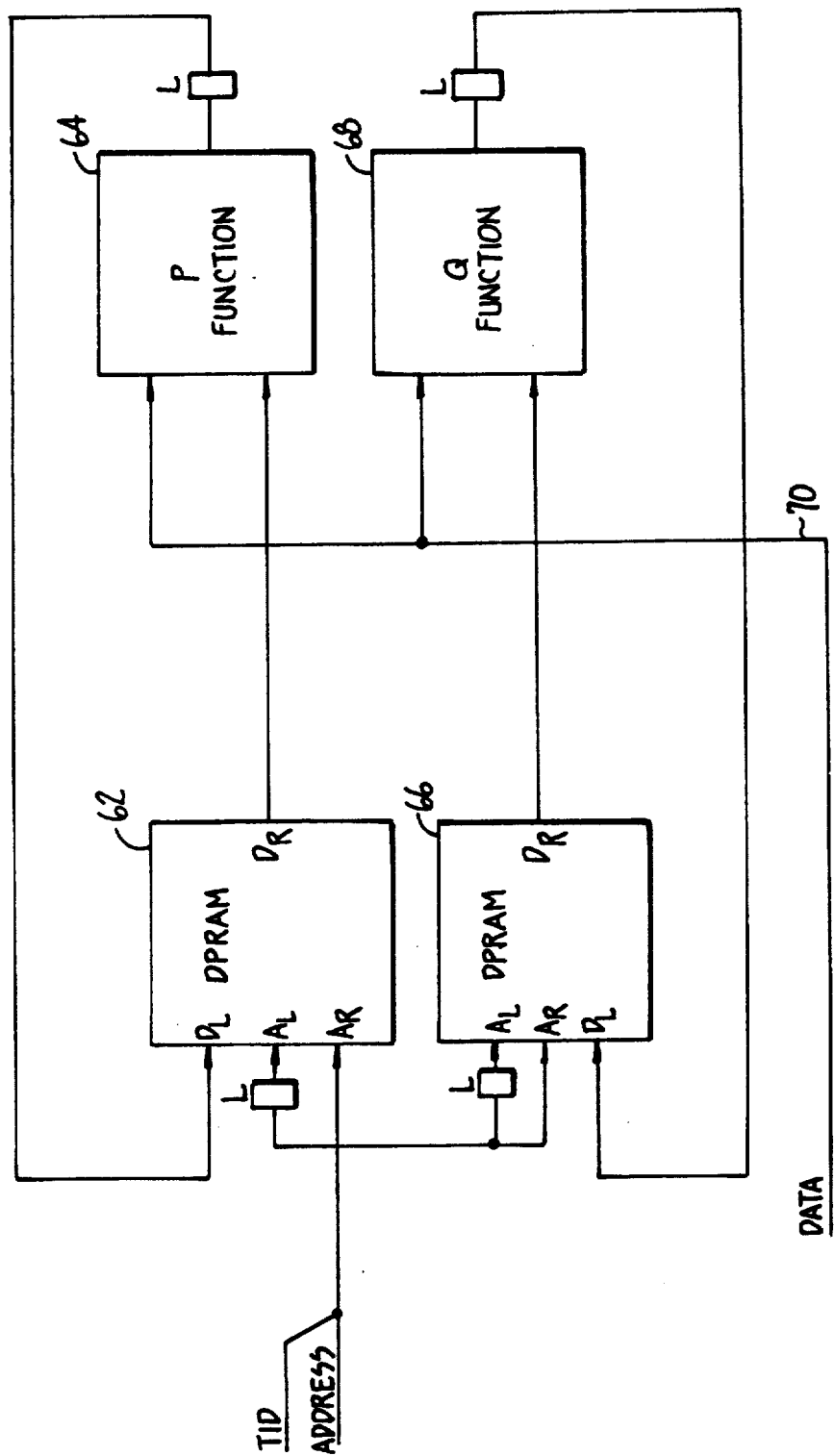
FIG._3.

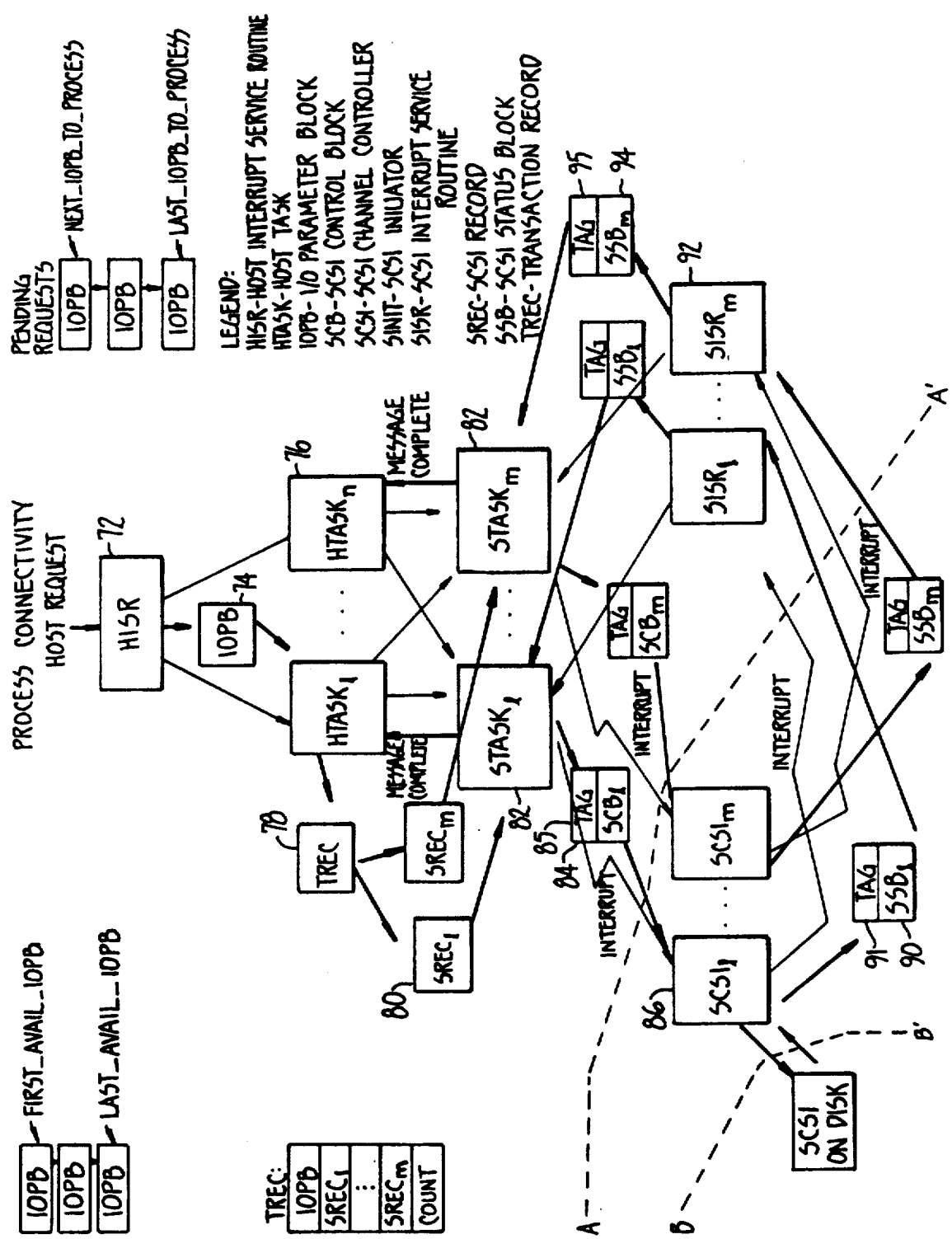
FIG._4.

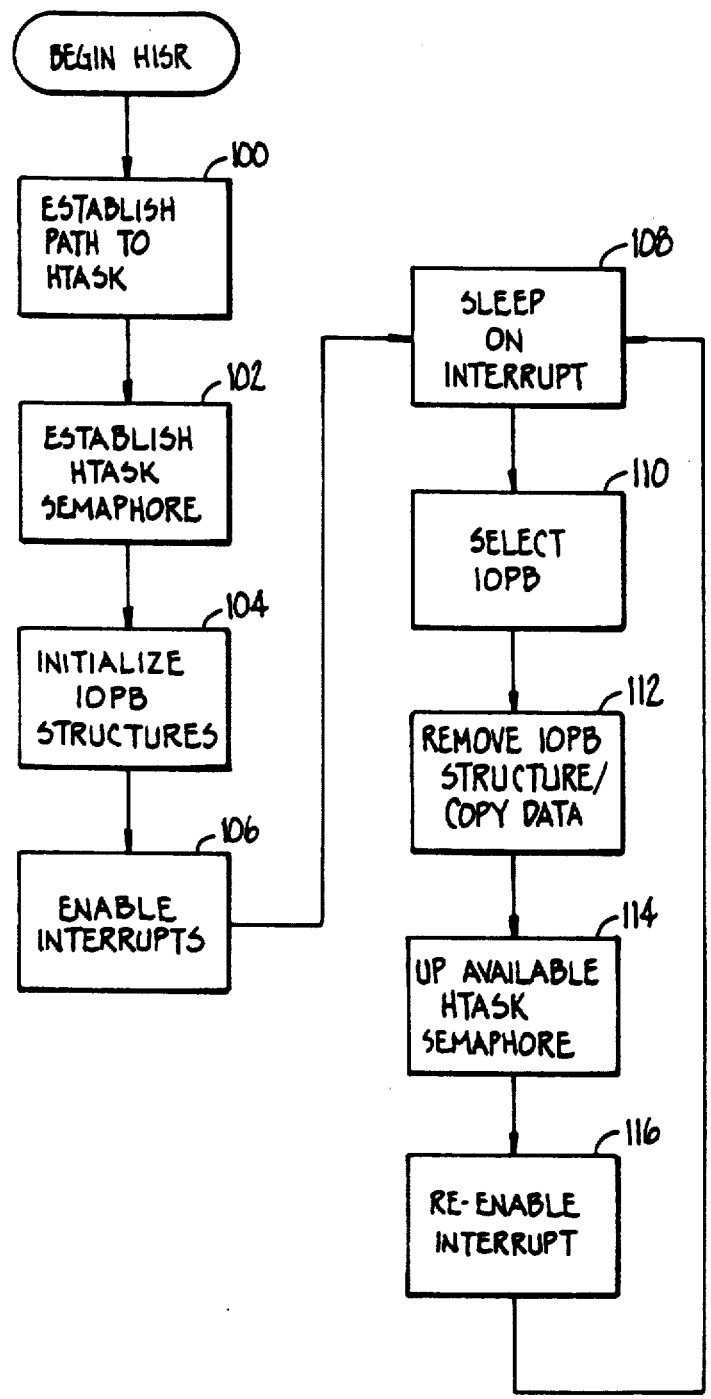
FIG._5.

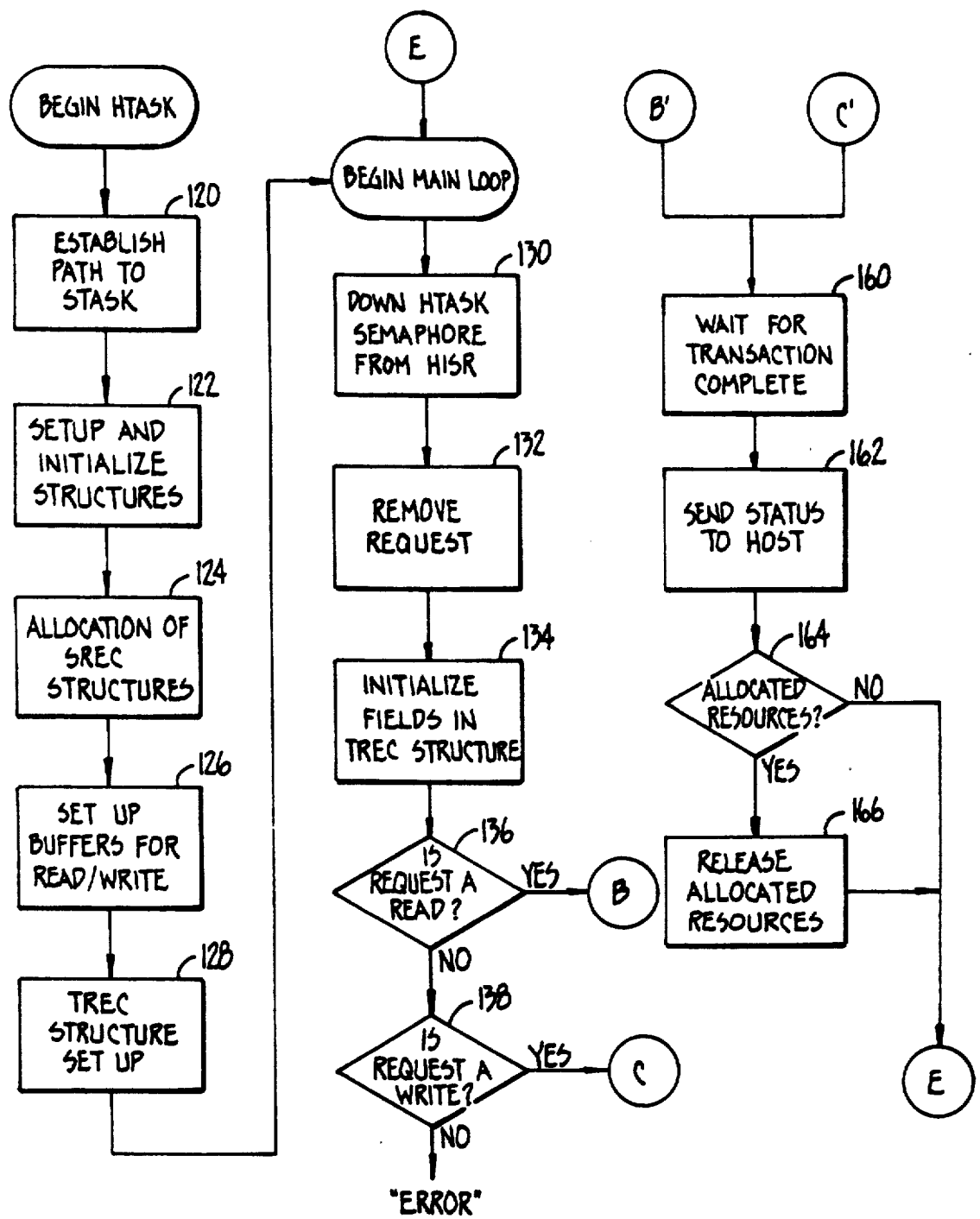
FIG._6a.

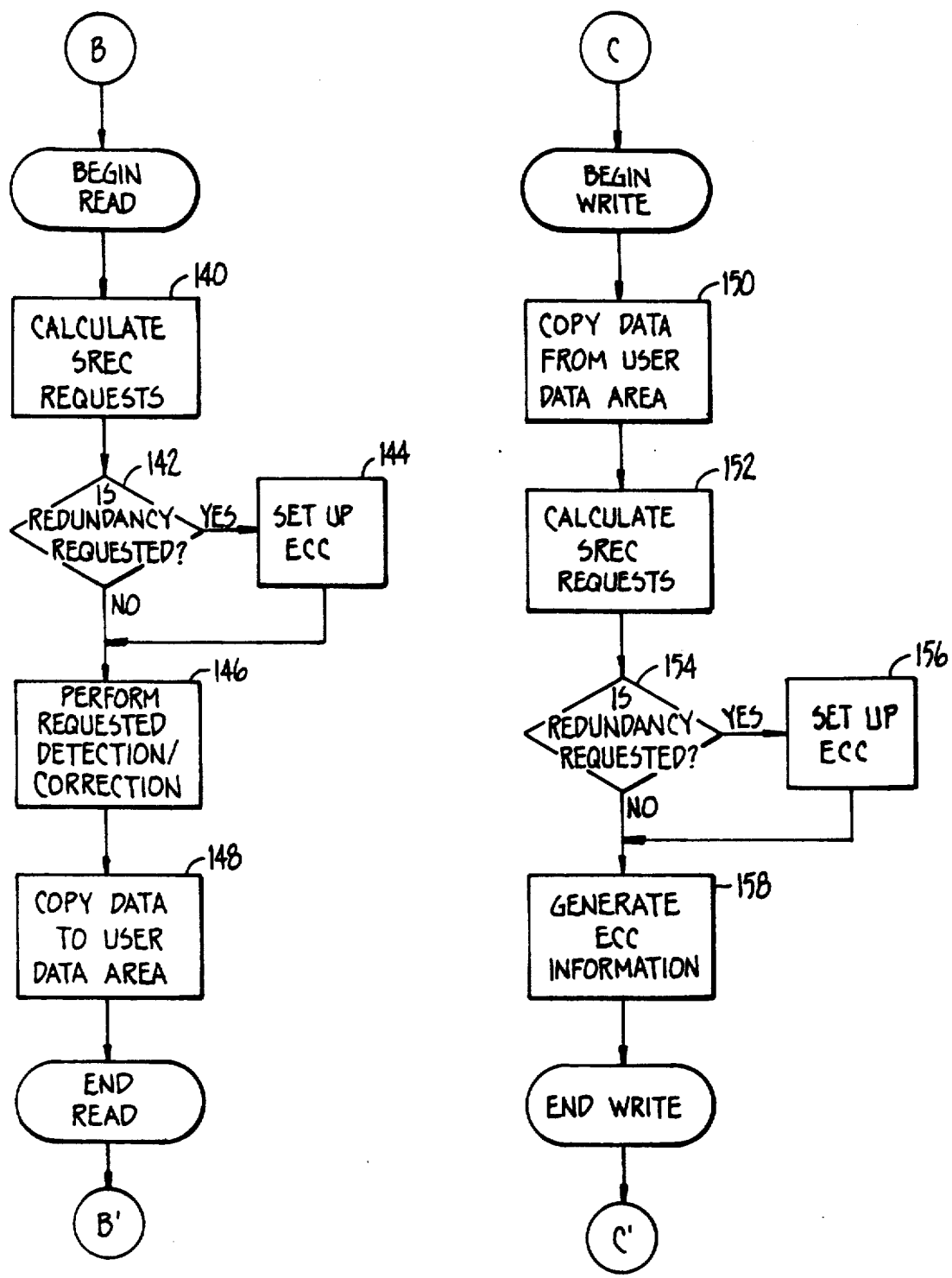
FIG._6b.

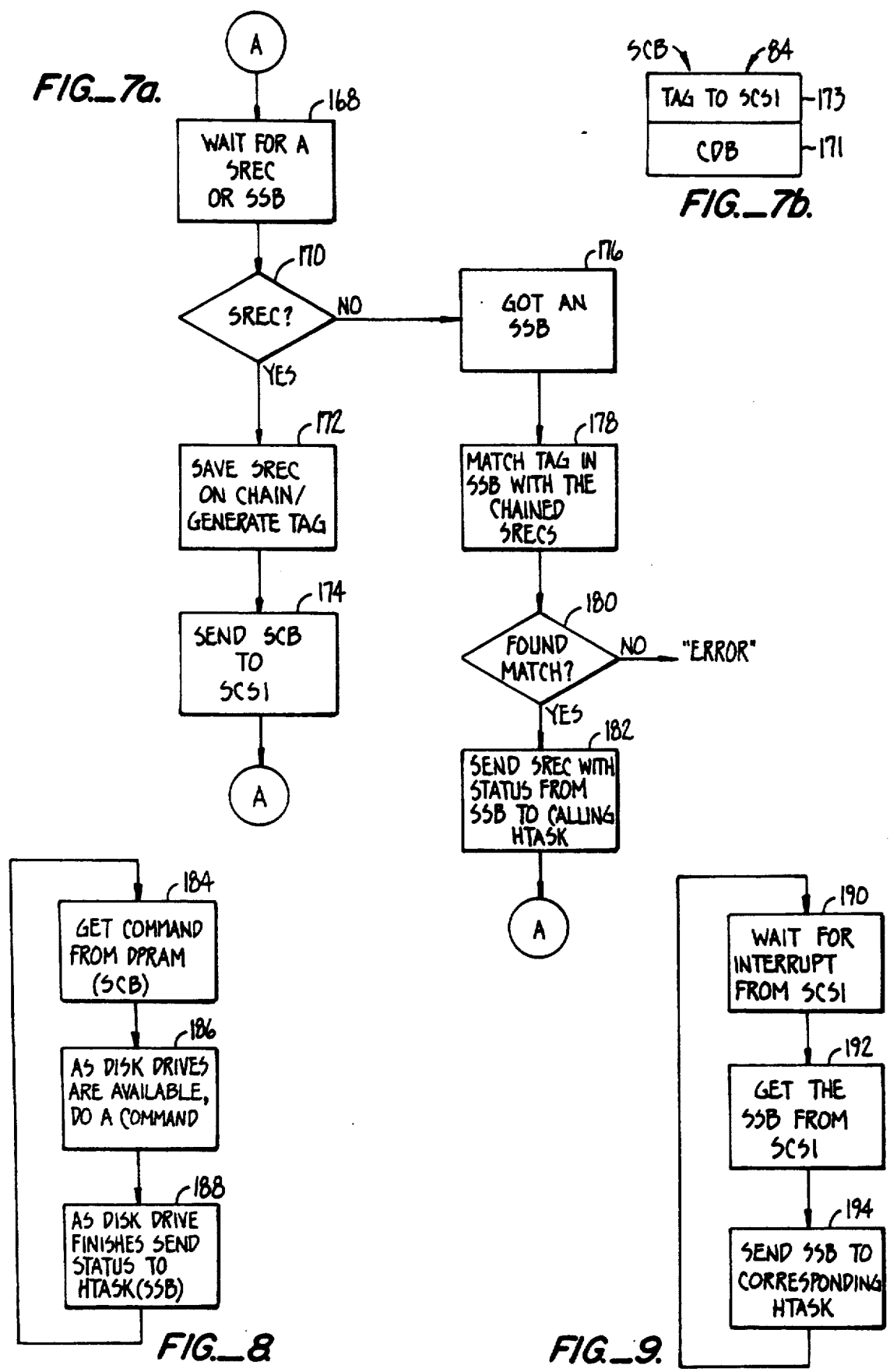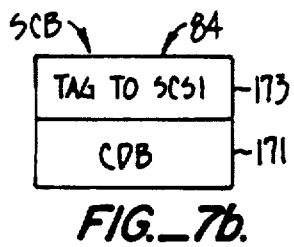

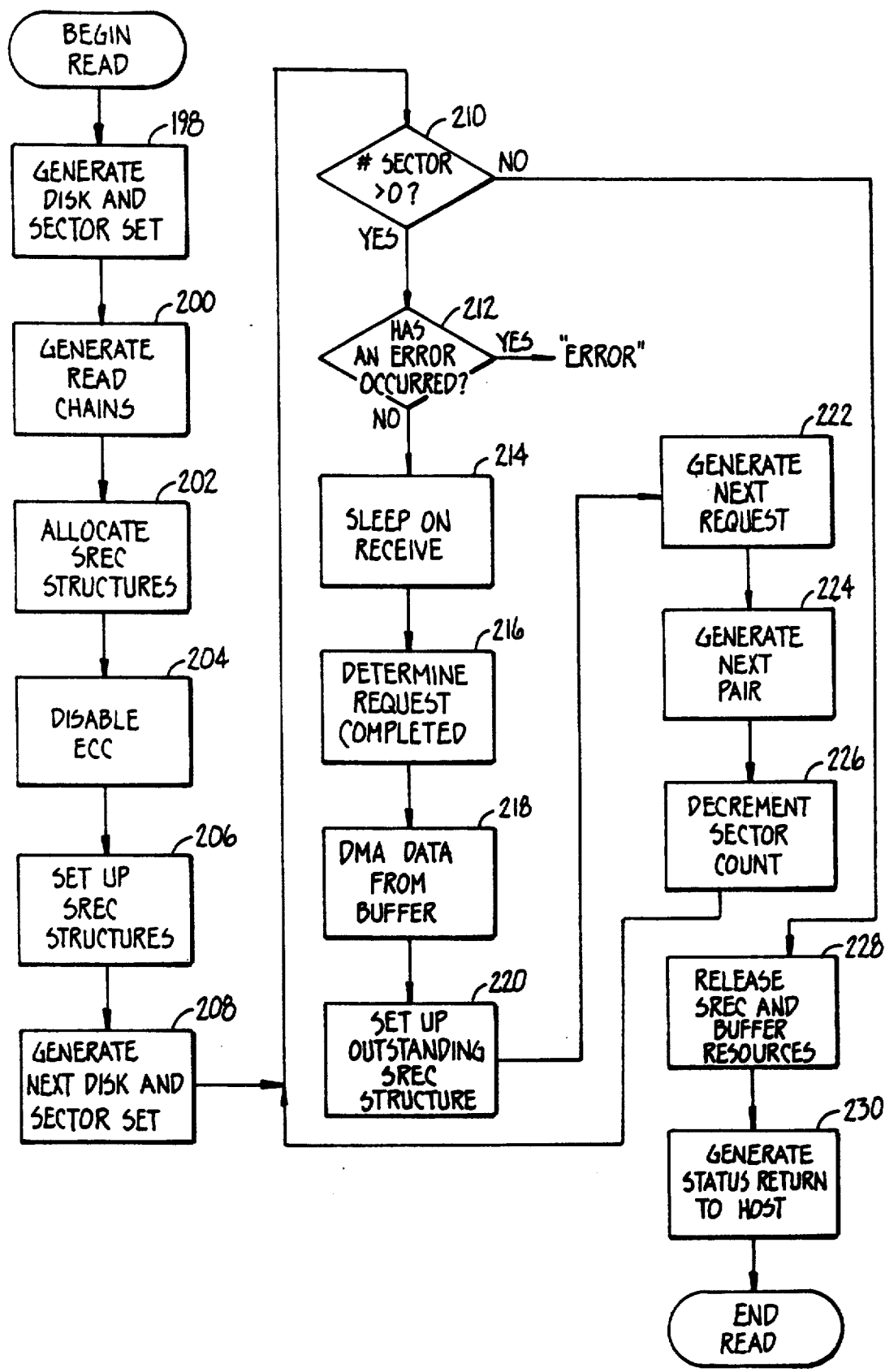
FIG_10.

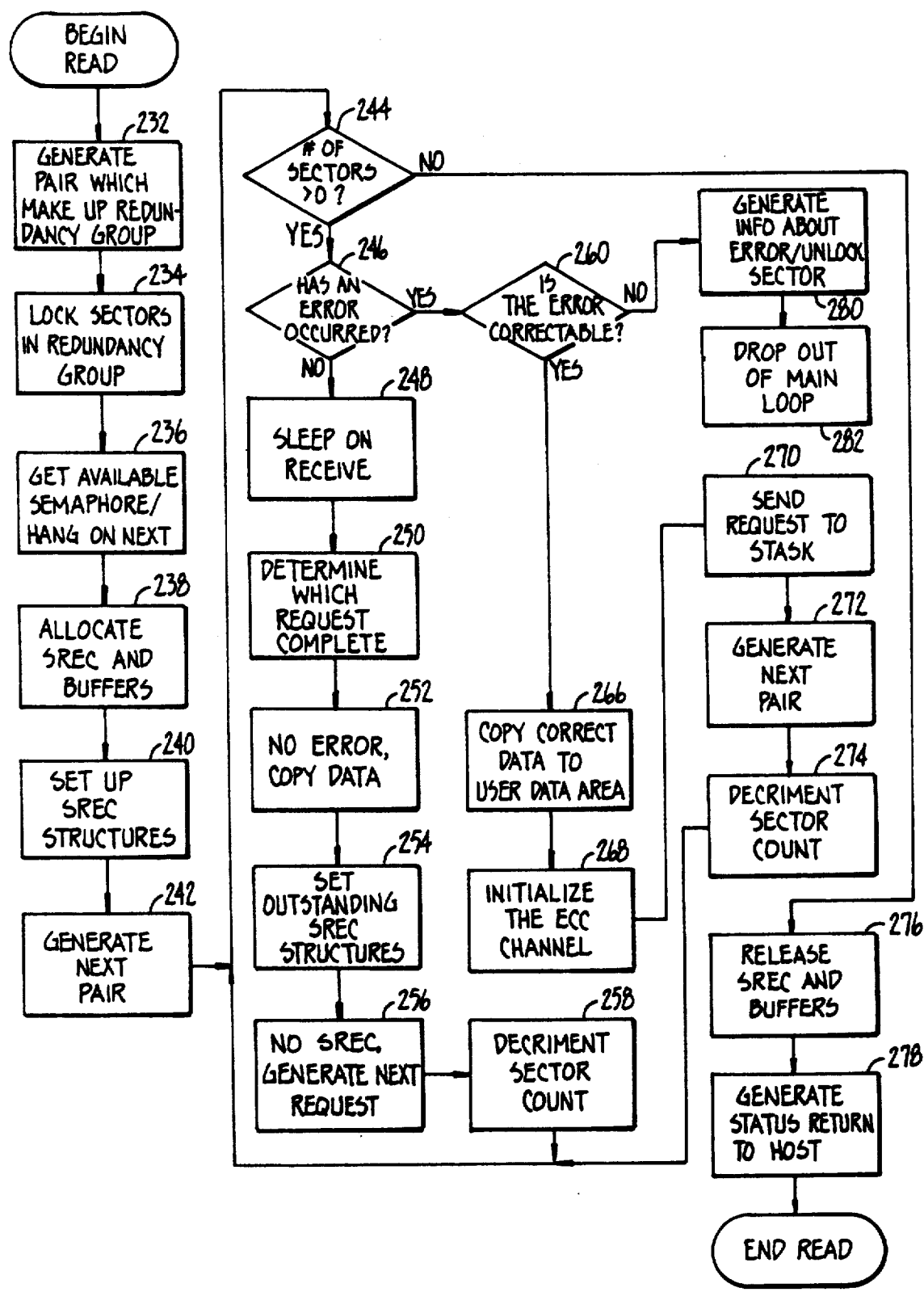
FIG._11.

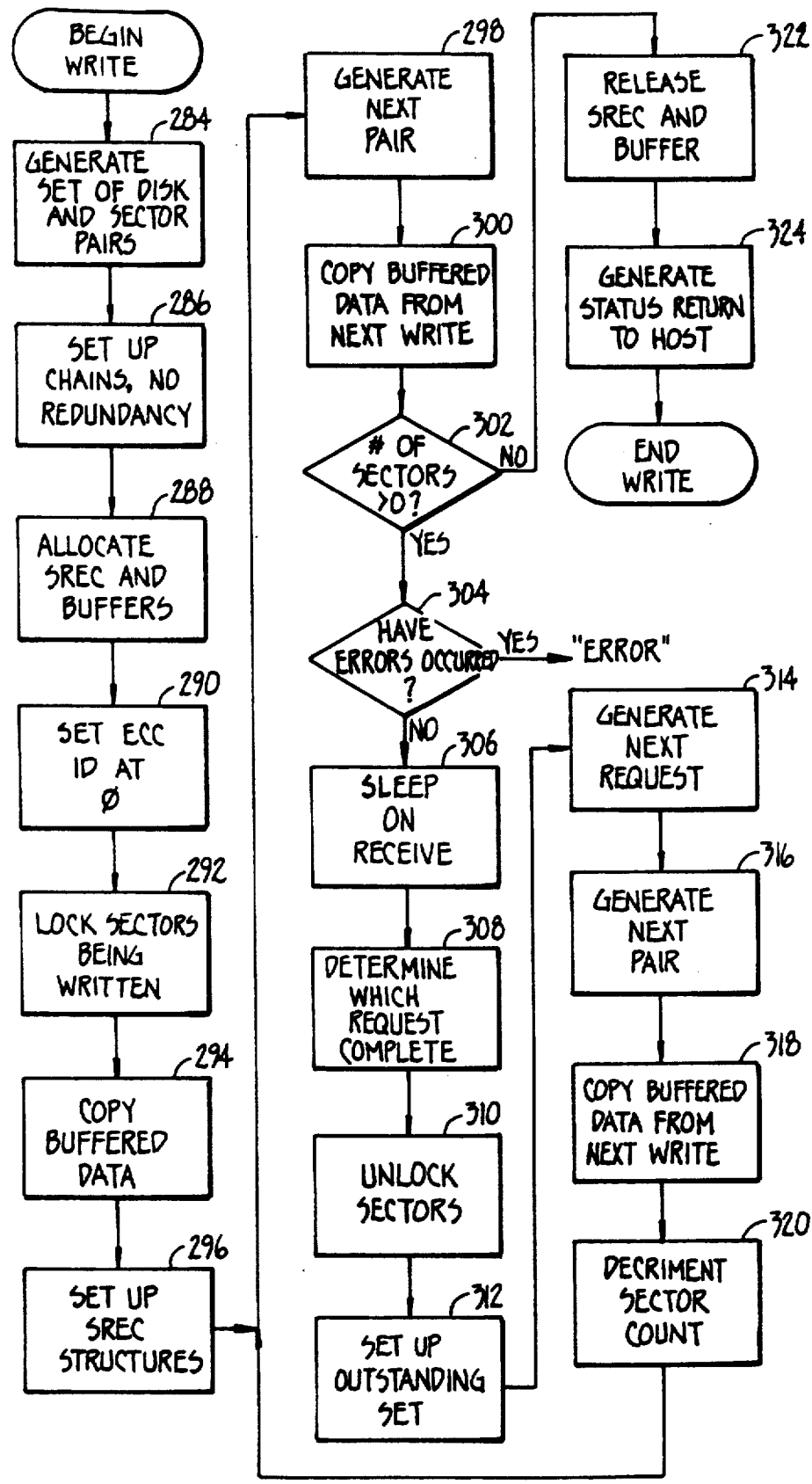
FIG._12.

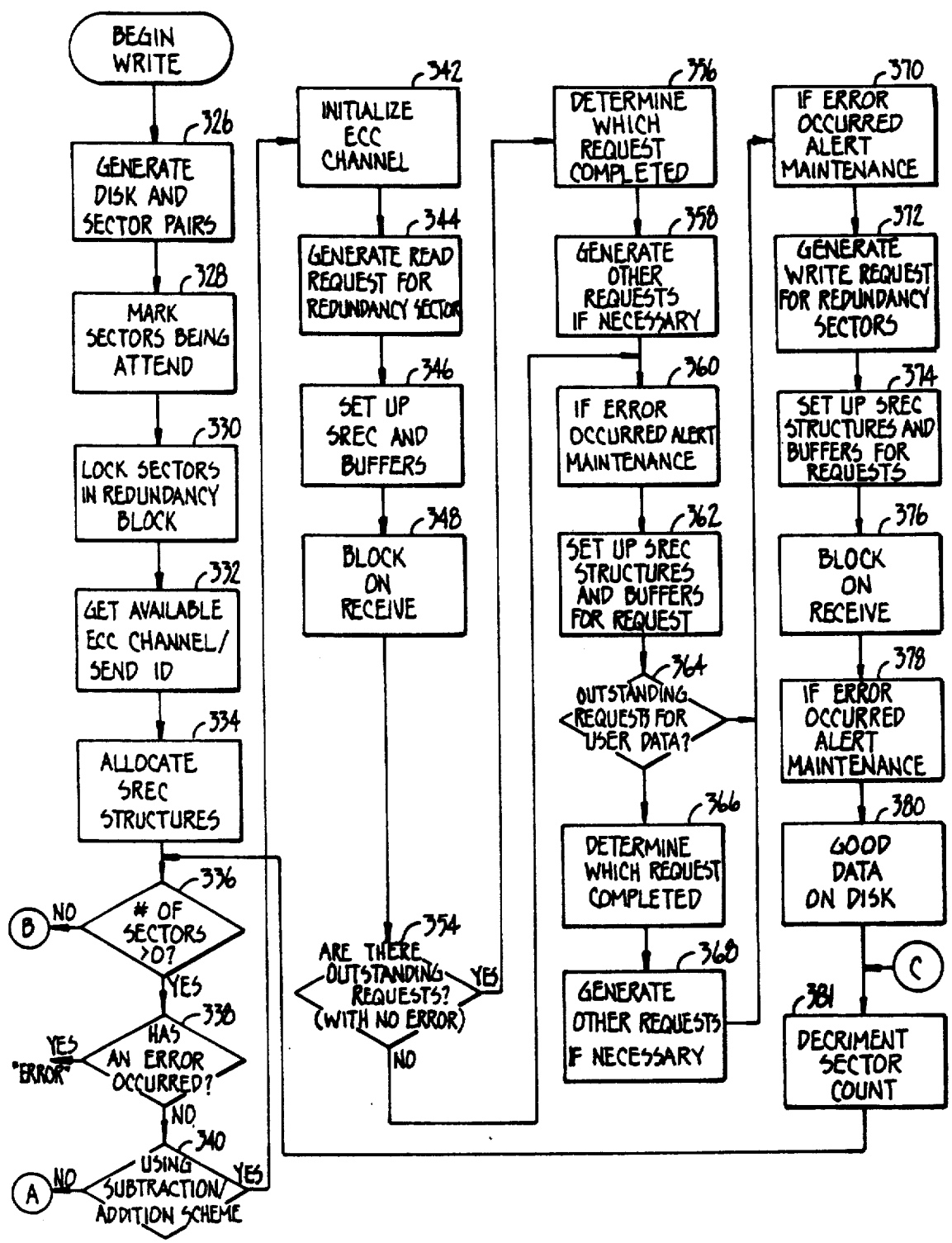
FIG._13a.

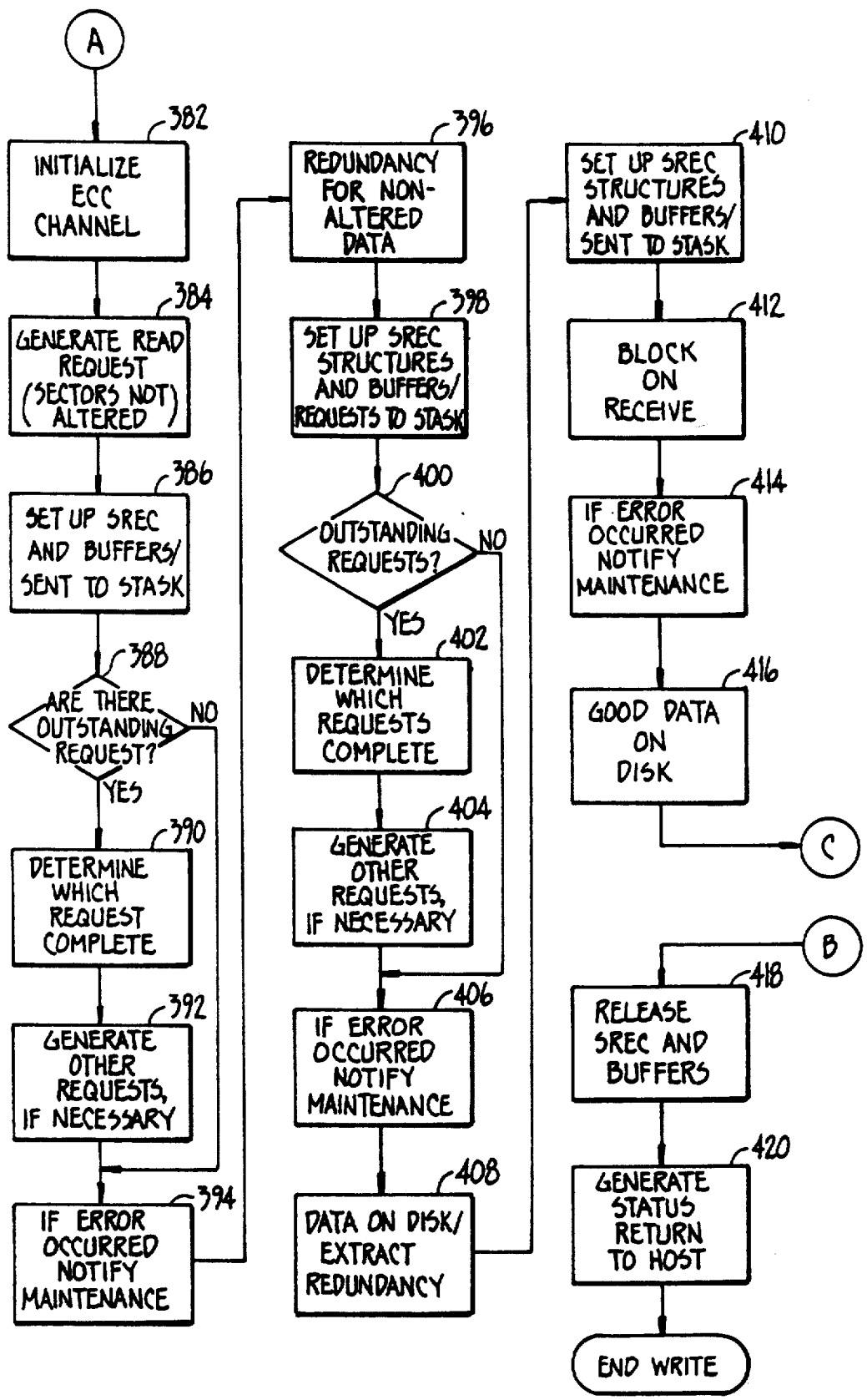
FIG._13b.

ARRAYED DISK DRIVE SYSTEM AND METHOD

This is a continuation of copending applicatin Ser. No. 07/270,713 filed on Nov. 14, 1988 now abandoned.

BACKGROUND OF THE INVENTION

1. Field of the Invention

This invention related to memory systems for a computer. More specifically, the invention relates to arranging a plurality of disk drives in an array and causing the array to have flexibility in configuration. Among the aspects of the array that are flexible are logical configuration of the disk drives, level of redundancy available, and allocation of spare disk drives.

2. Summary of the Prior Art

The disk drive is a well known memory storage device. There are basically two types of disk drives. One uses a magnetic medium, the other uses an optical disk. To increase memory performance, attempts have been made to increase transfer rates and storage density of disk drives. Unfortunately, the advances of physics have not kept pace with the speed requirements of computer systems. With this limitation, attempts have been made to produce large memory units with parallel channels and low access times, but with resultant reliability problems due to increased component count.

One embodiment has been the creation of disk drive arrays. A disk drive array has been built by Micropolis of Chatsworth, CA. In this array, the host computer sees the disk drive array as one large memory unit. Performance is increased, however, because smaller diameter disk drives can be used with redundant techniques to increase transfer rates and reliability. The disk drive array is also advantageous because it allows a high bandwidth of data to be written to memory. That is, multiple disk drives permits multiple paths to memory, therefore, a larger volume of data can be transferred to or from the disk drive array than from a single drive.

This rigid configuration has also been disclosed in concept by the University of California, at Berkeley. The University's Computer Science department has put forth an article discussing the use of disk drive arrays. The article gave the taxonomy of five different organizations of disk arrays, beginning with mirrored disks and progressing through a variety of alternatives with differing performance and reliability.

The first level of organization involves the use of mirror disks, a traditional approach for improving the reliability of disk drives. This is an expensive option since every write to a data disk is also a write to a check disk. Tandem Corporation which has used mirrored disks, doubles the number of controllers so that reads can occur in parallel.

The second level of organization posited by the prior art article involves the use of Hamming code. This level attempts to reduce the number of check disks. Since some accesses are to groups of disks, the second level does bit-interleaving of the data across the disks of a group and then adds enough check disks to detect and correct a single error. A single parity disk can detect a single error, but to correct an error enough check disks are needed to identify the disk with the error. For a group size of 10 data disks four check disk are needed, and for 25 data disks, five check disks are needed.

Furthermore, in level three, a conceptual discussion of a single check disk per group is presented. Through either special signals provided in the disk interface or the extra checking information at the end of a sector to detect and correct errors, many disk controllers can tell if a disk has failed. According to the prior art, the information on the failed disk is reconstructed by calculation the parity of the remaining good disks and then comparing, bit-by-bit, to the parity calculated for the original full group. When these two parities agree, the failed bit is a 0, otherwise it is a 1.

In the fourth level, independent reads and writes across different disks are contemplated. The advantages of spreading a transfer across all disks within the group is that large or grouped transfer time is reduced because transfer bandwidth of the entire array can be exploited. The following disadvantages also result. Reading/writing to a disk in a group requires reading/writing to all the disks in a group. Also, if the disks are not synchronized, average rotational delays are not observed Level four achieves parallelism for reads, but writes are still limited to one per groups since every write to a group must read and write the check disk.

Level five, on the other hand, discusses distributing the data and check information per sector across all the disks—including the check disks. Level five espouses the idea of having multiple individual writes per group. Accordingly, this arrangement would have the small-read-modify-writes which perform close to the speed per disk of level one while keeping the large transfer performance per disk and high useful capacity percentage of levels three and four. Thus, level five offers advantages in performance and reliability over a single large disk drive.

These levels of the prior art are fundamental, yet conceptual, principles underlying the use of disk arrays. Five separate, rigid configurations of a disk drive array are discussed and the advantages and disadvantages of each are presented. The embodiments of Tandem and Micropolis have also been set forth. These embodiments are similarly rigid and narrow in scope. Each embodiment emphasizes one characteristic that may be advantageous to a particular user. The shortcoming with these devices and concepts is that they are not flexible in meeting the needs of varied customers, or a single customer with varied needs.

Different customers have different needs depending on the type and amount of data they are storing. Also, the same customer can have varied data storage needs. The prior art, unfortunately, suggests only individual performance and/or reliability schemes. It does not present providing a customer with flexibility in deciding how large of a bandwidth, how high a transaction rate, or how much redundancy, etc., they may have made available to them, to match their needs. Given the cost of developing a disk drive array, its inability to provide flexibility to a customer makes its design for one application an almost prohibitively expensive risk.

SUMMARY OF THE INVENTION

Accordingly, it is object of the present invention to provide an arrayed disk drive system having the flexibility to be logically configured as one entire disk drive including all of the individual disk drives in the arrayed disk drive or as a collection of all the separate disk drives, or any configuration of disk drives therebetween.

It is another objective of the present invention to provide an arrayed disk drive system with a high bandwidth of operation or a high transaction rate, or any compromise therebetween.

It is another object of the present invention to provide an arrayed disk drive system which provides from none to multiple levels of redundancy (i.e., data loss protection) depending on the requirements of the user.

It is another object of the present invention to provide an arrayed disk drive system where striping of data to the arrayed disk drives is done in blocks.

It is another object of the present invention to provide an arrayed disk drive system with the capability of removing and replacing a drive while the arrayed disk drive is operating without affecting the operation of the arrayed disk drives.

It is another object of the present invention to have an arrayed disk drive system which has a plurality of spare disk drives, the spare disk drive assuming the logical position of any removed or defective disk drive.

It is another object of the present invention to provide an arrayed disk drive system having a disk controller which has an operating system therein.

It is another object of the present invention to provide an arrayed disk drive system having a disk controller capable of queuing requests from a computer.

It is another object of the present invention to provide an arrayed disk drive system which is capable of prioritizing requests from a computer.

It is another object of the present invention to provide an arrayed disk drive system having retargetable disk controller software.

It is another object of the present invention to provide an arrayed disk drive system capable of defining correct placement of a disk drive in the array of disk drives.

It is still another object of the present invention to provide an arrayed disk drive system which provides for simultaneous operation of a plurality of processors and buffers which are connected across a common data bus.

The attainment of these and related objects may be achieved through use of the novel arrayed disk drive system and method herein disclosed. An arrayed disk drive system in accordance with this invention has a disk drive array for providing memory to a computer, the array having a plurality of disk drives. The arrayed disk drives are accessed by a plurality of channels, each channel accessing a plurality of disk drives.

A disk controlling means is provided for controlling the logical configuration of the arrayed disk drives to appear to the computer as any conceivable arrangement of disk drives, whereby the arrayed disk drive may appear to the computer as the plurality of disk drives, or as one large disk drive comprised of all the arrayed disk drives, or any combination in between. Also included are means for providing a plurality of levels of redundancy on data read from or written to the arrayed disk drives from the computer. Lastly, there are means, controlled by the disk controlling means, for enabling from none to the plurality of levels of redundancy to operate on data being read or written from the arrayed disk drives.

BRIEF DESCRIPTION OF THE DRAWINGS

FIG. 1 is a schematic block diagram of the arrayed disk drive system of the preferred embodiment.

FIG. 2 is a schematic block diagram of the SCSI channel controller of the preferred embodiment.

FIG. 3 is a schematic block diagram of the ECC engine of the preferred embodiment.

FIG. 4 is a process connectivity diagram of the software of the preferred embodiment.

FIG. 5 is a flowchart of the operation of the HISR process of the preferred embodiment.

FIG. 6(a) is a portion of a flowchart of the operation of the HTASK process of the preferred embodiment.

FIG. 6(b) is a portion of a flowchart of the operation of the HTASK process of the preferred embodiment.

FIG. 7(a) is a flowchart of the operation of the STASK process of the preferred embodiment.

FIG. 7(b) is a diagram on the SCB of the preferred embodiment.

FIG. 8 is a flowchart of the operation of the SCSI process of the preferred embodiment.

FIG. 9 is a flowchart of the operation of the SISR process of the preferred embodiment.

FIG. 10 is a flowchart of the program to execute a read without redundancy of the preferred embodiment.

FIG. 11 is a flowchart of the program to execute a read with redundancy of the preferred embodiment.

FIG. 12 is a flowchart of the program to execute a write without redundancy of the preferred embodiment.

FIG. 13(a) is a portion of a flowchart of the program to execute a write with redundancy of the preferred embodiment.

FIG. 13(b) is a portion of a flowchart of the program to execute a write with redundancy of the preferred embodiment.

DETAIL DESCRIPTION OF THE PREFERRED EMBODIMENT

Referring to FIG. 1, the preferred embodiment of arrayed disk drive system 10 is shown. The arrayed disk drive system 10 serves as a memory unit for a computer 32. Its primary function is to perform reads from and writes to the disk drives 14 from the computer 32. The catch-all term which is used to includes both reads and writes is data transfers. A transaction is one complete read or write request from the host computer 32 to the arrayed disk drive system 10. As will be shown, the system 10 provides the flexibility to have large volume data transfers at a high transaction rate, or a large number of smaller data transfers at a high transaction rate, or any feasible combination therebetween.

The preferred embodiment of the arrayed disk drive system 10 has an array 12 of individual disk drives 14. The array 12 is arranged to have eleven (11) vertical channels 16. Each of these channels 16 ahs six (6) disk drives 14. These disk drives 14 may be either magnetic or optical and are accessed by channel controllers 18 through SCSI data bus 60 of FIG. 2. The disk array 12, however, is not limited to this number of channels or disks. For instance, it could be twenty-two channels and any multitude of disks.

Each of the channels is controlled by a small computer system interface (SCSI) channel controller 18. The SCSI controllers 18 will be described in more detail below. Each of the channels 16 accesses a common data bus 20 through the SCSI controllers 18. Also on the data bus 20 is an error correction and control (ECC) engine 22. The ECC engine 22, in cooperation with the arrayed disk drive system 10 software, provides one or two levels of redundancy to data being stored on the disk drives 14.

The system disk controller 24 is the main controller for the arrayed disk drive system 10. The controller 24 has a microprocessor 25. The microprocessor 25 has capabilities of ten million operations per second. This microprocessor 25 was chosen because of its architecture which was particularly suitable for the operation of the arrayed disk drive 10. The disk controller 24, additionally, includes an instruction cache 26 and an operand cache 28, located adjacent the instruction cache 26. The operand cache 28 has a capacity of 64K bytes. A write buffer 30 is also provided in the disk controller 24.

The disk controller 24 controls data transfer between the arrayed disk drives and the computer 32, from the standpoint of memory and redundancy allocation. To facilitate communication between the computer 32 and the arrayed disk drive system 10 a host interface card 34 is placed internal to the computer 32. The host interface card 34 acts as an interface and buffer between the host VME bus 36 and the DMA cable 38 which connects the computer 32 to the disk array system 10. The DMA cable 38 is connected to a cable driver 40. The cable driver 40 is a two directional buffer. It is connected on the other end to the data bus 20 and passes data from the cable 38 to the data bus 20, and vice versa.

A microprocessor memory 42 (which is also referred to as the memory buffer 42) is also located on the data bus 20. Data is stored in this buffer when it is written in from the computer during a write request. Data is similarly stored in this microprocessor memory 42 as it is read out of the disk drives in response to a computer read request. An error detection and correction unit 44 is connected to the microprocessor memory 42. It performs an error detection and correction scheme on all data read and written to the microprocessor memory 42. It is unrelated to the redundancy performed by the ECC engine 22.

Lastly, a customer engineering panel 46 is provided. It is also connected to the common data bus 20. The customer engineering panel 46 provides a plurality of functions. Among those are allowing the customer access to the data bus 20 for running diagnostic software, providing a floppy drive so that software can be input to change the logical configuration of the disk drives, and running maintenance software, etc. The customer engineering panel 46 houses one of the maintenance microprocessors. This processor along with the disk controller 24 run the maintenance process (described in more detail below). Customer engineering panels are generally known in the art.

ARRAYED DISK DRIVE SYSTEM HARDWARE

Focusing on the arrayed disk drive system 10 hardware, attention is drawn to the left side of FIG. 1. The host interface card 36 is placed inside the computer 32. By design it is a simple card so that it is applicable to different interfaces to accommodate customers with different interfaces. This interface can, alternatively, be in the disk controller 24 offering any of a multitude of different interfaces. In the preferred embodiment the interface selected was a VME which is a standard international interface. The cable 38 is a DMA (direct memory access) cable. It is a non-specific 32 bit data line with protected interface. The cable 38 goes through cable drivers 40 which are actually on the processor card 48. The cable drivers 40 turn what is TTL (transistor-transistor logic) signals on the card 48 into differential signals for the cable 38 for data and status being sent back to the host 32.

There are 100 pins in the cable 38, thus providing 50 differential signals. Of these 50, 32 are data bits and the balance of the 50 are either parity or control signals. The use of differential signals eliminates problems due to differences in ground potential between the host computer 32 and the arrayed disk drive 10 on card 48. Data signals on the processor card 48 are TTL signals usually 0-5 volt digital logic.

Data coming from the host via the cable drivers 40 to the arrayed disk drives is initially stored in the microprocessor memory 42. The error detection and correction unit 44 performs error correction and detection of data written to and subsequently read from the microprocessor memory 42. The unit 44 operates only on the data going into or coming from the microprocessor memory. The unit 44 performs a modified Hamming code operation of the data. The modified Hamming code is well known in the art. It detects all two bit errors. The Hamming code associated with the memory buffer 42 generates the check bits that are written into the memory 42. Upon reading, it regenerates the check bits, conducts checking with the data, and performs necessary corrections. When the Hamming code is generated, parity coming from the host 32 is also checked. The host interface card 34 creates parity for the data and that same parity bit is passed down the Hamming code and the Hamming code strips off the parity bit and generates the check bits. Conversely, when data is read out of the microprocessor memory 42, the check bits are checked and a byte level parity is regenerated so all of the internal buses have 32 bits a data and 4 bits of parity.

In the preferred embodiment the microprocessor memory 42 is RAM, packaged as an integrated circuit (IC) chip. Therefore, increases and decreases in the size of the microprocessor memory can be accomplished by replacing the IC chip with a memory of a desired size. The microprocessor memory 42 has two functions. One is speed matching. In other words, it enables transfer to and from the host computer 32 at whatever speed the host 32 can take. Also, the microprocessor memory 42 is where the accumulation of striping data occurs. Data received from the host is placed in segments in the microprocessor memory 42. Likewise data from the disk drive array 12 is collected as segments in the microprocessor memory 42 before being placed on the bus over to the host 32. These segments are generally referred to as stripes, and a particular method of arranging the segments throughout the arrayed disk drives is referred to as striping.

Striping means putting a single data file (a full transaction of data from the host) across multiple disk drives to allow a higher degree of reliability and a faster transaction time. If one drive goes bad the data on the other drives is not affected. Also, by writing the data to a plurality of disk drives the transaction rate is increased because of the parallel processing capabilities of the channel controllers 18. For example, if there are two disk drives, each functioning at one megabyte per second, and a two kilobyte file is striped, one kilobyte of data is written to each disk drive and the effective transfer rate now becomes 2 megabytes per second. The microprocessor memory 42 is used instead of a cache memory because the arrayed disk drive system 10 is a memory device and most host computer have their own internal cache memories. This microprocessor memory 42 may also be used to perform read aheads and other performance improvement operations.

Once the data is residing in the microprocessor memory 42, a DMA is set up from the microprocessor memory 42, through the Hamming code at unit 44, on to the data bus 20 and down to the disk drive array 12. DMA simply means that the transfer is hardware controlled and there is no processor intervention. Every cycle of the bus is another transfer of information. DMA typically gives a starting address and then conducts a sequential number of transfers sufficient to transfer all of the data for the specific transaction. In actuality, the address specifies the channel, disk, and sector number where the incoming data is going to be stored. Thus, the starting address is given and then burst of 512 bytes of data are transferred without additional allocation of address space. Note, the size of the word burst could alternatively be 1024, or 1536, or 2048, etc.

It is important to note at this point that a disk is comprised of a plurality of cylindrical tracks, starting in the center and increasing radially outward therefrom. Each of these tracks is comprised of a plurality a sectors. From the standpoint of the disk controller 24, these sectors are sequentially numbered beginning at zero and running to the total number of sectors on that disk. The usual size of a sector is 512 bytes, although multiples of 512 bytes could just as readily be used. Each disk 14 is identical. Therefore, sector number 0 on disk 5 is in the same location with respect to disk 5 as sector number 0 is on disk 11 with respect to disk 11, and so on. The disks 14 begin with number 0 and run to 65.

At the array 12 the data is received by a plurality of channel controllers 18. One channel controller 18 is provided for each of the eleven channels of the array 12. A channel, for example, the farthest most channel 19 toward the right may be designated as a spare. Each channel controller 18 is comprised of a substantial amount of hardware. Referring to FIG. 2, the hardware includes an 8 bit microprocessor 50, 32 kilobytes of dynamic or static RAM (random access memory) 52, a dual port RAM (DPRAM) 54, a DMA engine 56 and an 8-bit small computer system interface (SCSI) channel processor 58. Once inside the channel controller 18, the SCSI processor 58 will DMA the data down to the disk drive.

The channel controllers 18 conduct parity on the data received from the microprocessor memory 42. This parity is passed down through the SCSI Controller 18 to the disk drives 14. The SCSI bus 60 on which the data is passed to the disk drive is nine bits wide, including eight data bits and one parity bit. An embedded SCSI controller is located on each disk drive 14. This embedded SCSI controller generates a parity bit and then compares it with what was sent down from the corresponding channel controller 18. This check is done before data is written to the disk. Errors detected by any of the above described parity schemes and Hamming codes are logged with the system disk controller 24.

The parity or error detection and correction scheme used by the embedded SCSI controller is generally referred to as Fire code. Fire code is a mathematical code for detecting and correcting short bursts of errors within a very long field. Fire codes have been used in disk drives since about 1955 in different forms and are generally well known in the art. The fire code generator, a microprocessor and a microprocessor memory are all located within the disk drive 14 itself.

Referring again to FIG. 1, the system disk controller 24 is the main processor for the arrayed disk system 10. Each of the SCSI channel controllers 18 also has a microprocessor 50. Each of the processors 24 and 50 is capable of bus arbitration. A "grey code" generator is used to do the bus arbitration and bus allocation. Grey code is known in the art. Every processor and memory with bus access can do DMA (direct memory access) transfers. The grey code generator allows each channel to do a DMA if it has something queued up and has a request. Each of the SCSI controller processor 50 has an interrupt that it can generate when tne grey code generator comes around permitting it to do a DMA. Therefore, a plurality of data transfer transactions can be processed in the controllers 18 simultaneously. One controller 18 can be writing or reading from the disk array 12 while another controller 18 is accessing the data bus 20. The system disk controller 24 has priority in that it is awarded every other access cycle on the data bus 20.

The disk controller 24 is basically software which is run on a microprocessor 25 (of FIG. 1), and the microprocessor's caches and buffer. A suitable microprocessor is the MIPS R2000, made by MIPS of Sunnyvale, Calif. The combination of the microprocessor 25, instruction cache 26, the operand cache 28, and the write buffer 30, comprise the system disk controller 24. A maintenance processor 27 is also located in the disk controller 24, on the microprocessor 25. It performs maintenance functions.

The maintenance unit is comprised of the maintenance processor 27 and a second maintenance processor 45 located in the customer engineering panel 46. The seconc maintenance microprocessor 45 controls switches and lights which indicate status of the drives. If more than one arrayed disk drive system 10 is connected to a computer, the additional systems 10 may not have a system disk conrroller 24. The disk controller 24 in the initial system will be used. The additional systems, however, will have their own second maintenance processors 45 monitoring/controlling disk status and interrupts. The maintenance process operates in the maintenance unit.

Returning to the disk controller 24, the instruction cache 26 of the disk controller 24 has 64 kilobytes of space and stores the most frequently requested disk controller 24 instructions. The instruction set ror the disk controller 24 is stored in the microprocessor memory 42. Instructions are called by the disk controller 24 and stored in the instruction cache 26 when they are being used. The instruction cache 26 has a hit rate of about 90–95%. In other words, the disk controller 26 is able to get the instruction it wants from the instruction cache 90–95% of the time, instead of having to take time to go out to the separate slower microprocessor memory 42 and get the instruction. The instruction cache 26 allows tne disk controller 26 to maintain processor speed.

Also attached to the disk controller is 64 Kilobytes of operand cache 28 and a static memory write buffer 30. The operand cache 28 is for software data and not customer data. The cache 28 does not contain any customer data that will be written to the disk drives 14. For example, the software data is: how many transactions are there outstanding? What computer did the data come from? What kind of data is it?, etc. The microprocessor memory 42 operates at a considerably lower speed than the disk controller 24. The microprocessor memory runs at about 150 nanoseconds. The operand and instruction cache run at about 25 nanoseconds. Therefore, six reads or six writes can be done to the static RAM 30 in the same time it takes to do one read or write to the microprocessor memory 42. The static RAM write buffer 30 is essentially a speed matching device between the disk controller 24 and the microprocessor memory 42.

ERROR CORRECTION AND CONTROL

The Error Correction and Control (ECC) hardware or engine 22 is located on the data bus 20. The ECC engine 22 cooperates with software run by the disk controlled 24 to provide up to two levels of redundancy. The redundancy operation actually include five aspects. The first is the SCSI controller 18 which interrogates a disk drive 14 when it reports an error for information about the error. The second is an exclusive-OR redundancy information generator. The third is a Reed-Solomon redundancy information generator. The fourth is the generation of redundancy syndromes. The fifth is software run in the disk controller 24 which coordinates the redundancy program.

Redundancy is utilizing additional data storage capacity to mathematically recreate data lost or a storage device. The physical calculation of the exclusive-OR and Reed-Solomon redundancy information is done by the error correction and control (ECC) engine 22. If a customer desires one level of redundancy the exclusive-OR redundancy algorithm is enabled. If a customer desires two level of redundancy both the exclusive-OR redundancy and Reed-Solomon redundancy is provided. For purposes of brevity the exclusive-OR redundancy is referred to as "p redundancy." Similarly, the Reed-Solomon is referred to as "q redundancy."

The ECC engine 22 calculates p and q redundancy as the data is DMAed from the disk controller 24 to the channel controllers 18 along the data bus 20. For example, if three sectors worth of data are being transferred down the data bus 20 to the different drives, and one level of redundancy is desired, an additional sector, containing p redundancy information would be calculated by the ECC engine 22 and written to a fourth drive. If, for the same three sectors of data, two levels of redundancy where desired, the p and q redundancy calculated by the ECC engine 22 is written down to a fourth and fifth drive, respectively.

The design of the hardware is such that the redundancy calculations are done "on the fly" as data is transferred along the data bus 20. In other words, the redundancy calculations done in hardware occur for every transaction of data along the data bus 20. The p and q redundancy functions are simply clocked on data signals on the data bus. Whether the results of these functions are written to a disk drive 14 is wholly controlled in software. If the customer desires no redundancy, the disk controller 24 software configures the arrayed disk drive system 10 not to calculate the redundancy functions. If the customer desires only one level of redundancy, the arrayed disk drive system 10 is configured to write only the p redundancy information to disk. Similarly, if two levels of redundancy are requested, both the p and q redundancy information, calculated by the ECC engine 22 is written to disk.

ECC HARDWARE

Referring to FIG. 3, a block diagram of the ECC engine is presented. The p redundancy will be focused on first. When the disk controller 24 decides that it has three sectors of information to be written to disk, it will tag each block of information as being part of the same transaction. By way of illustration, the first of the three block is sent to the first channel controller 18a (of FIG. 1) to be written to (or, in other words, striped on to) a sector in one of the controller's 18a disk drives 14. While on the data bus the data in the first block is picked up by the ECC engine 22 and run through the exclusive-OR function block 64 where it is exclusive-ORed to all zeroes. Therefore, the output of the function block 64 is the same as what was input. This output is stored in DPRAM 62.

The second block of information is then transferred by the disk controller 24 to the second channel conrroller 18b, to be written to the appropriate sector on one of the second controller's 18b disk drives 14. The second block of information is picked up off the data bus 20 by the ECC engine 22. It is then exclusive-ORed to the first block of information which is retrieved from its location in DPRAM 62. The result of this exclusive-OR function is stored in the same location in DPRAM 62 as was the result of the first exclusive-OR operation.

Likewise, when the third block of information is sent by the disk controller 24 to the third channel controller 18c (to effect striping) it is exclusive-ORed by the p redundancy function block 64 to the result of the previous exclusive-OR function. This result is the exclusive-OR of all the three sector's worth of data. The function is done bit by bit but the result is obtained as a 512 block of p redundancy. This function is read into the same location in the DPRAM 62 as the previous results for this transaction. The ECC engine monitors the tag or transaction number on each of the three blocks of data sent by the disk controller 24. When it sees that the third one has been exclusive-ORed to the rest, it writes the result block of p redundancy function which are in the same DPRAM 62 location, or channel, into a fourth sector. The transaction is then complete and three sectors of data and one sector of p redundancy have been written to disk.

If upon a read, an error was detected on a data sector, as opposed to a redundancy sector, the p redundancy could regenerate the lost data. The SCSI contro ler 18 would have noted from which sector it could not read. It would inform the disk controller of this. Tne disk controller 24 would then know the two drives, in following with the above example, that had correct data. If two of the three disk are known, and parity for all three (the p redundancy) is also known, it is a simple process to recreate each bit for the lost sector. It must be whichever state, when exclusive-ORed with the others, produces the p redundancy sector. The ECC engine 22 makes this calculation automatically and places the result in DPRAM 62.

Each location in DPRAM 62 where results are stored is called a channel. There are sixteen (16) channels in DPRAM 62 each having a volume of 512 bits (the size of a data transfer block). Alternatively, a larger number of channels could be used, for instance, 128 or 256 channels. When data is going to be transferred on the data bus 20 and redundancy is to be performed, the disk controller 24 will initialize and enable one of these channels so that the redundancy function can be generated and stored in the initialized channel. When the operation is complete, i.e., the redundancy information is written to disk, the same channel can be re-initialized and used by another data transfer redundancy operation.

If two levels of redundancy are required a q redundancy is performed in addition to the p redundancy performed immediately above. The q redundancy function is a Reed-Solomon algorithm. A Reed-Solomon algorithm basically consists of the multiplying the data in the three sectors against a specific polynominal, that specific polynominal being a constant which can be used to identify the data. Reed-Solomon is a well known algorithm. As described above, in connection with the p redundancy, the first block of data being transferred by the disk controller 24 to the first channel 18a is input to the q function block 68. This occurs at the same time the data is input to the p function block 64, because the common ECC bus 70 connects both function block 64 and 68 to the data bus 20. In the q function block 68 the data in the first block is multiplied by a specific polynominal (a distinct constant).

Upon completion the result is stored in a location, or channel, in the q redundancy DPRAM 66. When the second sector of data is transmitted on the data bus 20 the same q function is performed on it in combination with the result of the first multiplication. This result is stored in the same location in DPRAM 66 as was the first result. The third block of data is treated similarly, and the result of the q redundancy operation on it is written to the same location is DPRAM as the previous result for those blocks of the same transaction number. Once calculated, the q redundancy is written, in the present example, to tne fifth sector. The q redundancy channel can then be re-initialized for the next data transfer. Alternate methods of error detection and correction could also be used.

It is important to note at this point that each time a read is performed not only can the SCSI controller 18 detect an error, the p and q redundancy functions can detect an error. During a read both redundancy functions create redundancy information for the data being transferred. This is the same redundancy information that was written to disk in the p and/or q redundancy sector, if one or both levels of redundancy was requested. This generated information is then exolusive-ORed to the redundancy information in the respective p and q redundancy sectors. If what was read out was the same as what was read in, the result of the exclusive-OR should be zero. If it is not zero this means that the data being written out is not the same as the data being written in, and thus, that an error has occurred. The result of the p redundancy exclusive-OR with itself is called the p syndrome. Similarly, the result of the q redundancy exclusive-OR with itself is called the q syndrome. Anytime a syndrome is nonzero an error has occurred. The disk controller 24 software then steps in to see if can recreate the lost data using the ECC engine 22.

ECC SOFTWARE

The ECC engine 22 is a hardware method of generating redundant data. Redundancy capabilities in the arrayed disk drive system 10, however, are largely a product of software. This is the fifth aspect of the redundancy operation as mentioned under Error Correction and Control. The software, which resides primarily in the disk controller 24 and marginally in the maintenance processor 27, coordinates the plurality of status signals, the transfer of data blocks and the created redundancy information. For a better understanding of how the ECC software functions and how it interplays with the ECC engine 22 an analysis of reads and writes with several possible error conditions is given.

The arrayed disk drive system 10 can calculate both p and q redundancy when writing data to the disk. On redundant reads, the arrayed disk drive system 10 calculates p and q redundancy syndrome. A syndrome is the result, for p redundancy, of the exclusive-OR of 11 the data sectors in a redundancy group with the p redundancy sector for that group of data sectors. The p syndrome should be zero. If the p syndrome is not zero then an error has occurred. The q syndrome is basically an exclusive-OR of the scaled data (multiplied by a distinct constant) with the q redundancy sector. Again, if a nonzero results from this operation, an error has occurred. Using this ECC information, in many cases, the arrayed disk drive system 10 can identify and correct faulty data.

There are many possible error cases, but these result in just a few types of actions: identifying unknown errors, correcting errors, and reporting errors. An error is deemed "unknown" if the SCSI channel controller 18 does not report the bad disk, but the ECC data indicates an error (a nonzero syndrome). In general, if there is one redundant drive in a redundancy group, one known error can oe corrected. If there are two redundant drives then two known errors can be corrected or one unknown failure (not flagged by SCSI) can be identified and corrected.

Uncorrectable errors will generate an error back to the host and also generate an error report to the maintenance processes housed in the customer engineering panel 46. Among those cases which are not identifiable or correctable are: (1) the identity of an unknown fault with only one level of redundancy provided, and (2) the identification and correction of more than a single unknown fault if there are two redundant drives. With this in mind the performance of a read request with different levels of redundancy activated is now described.

Beginning with a simple read, the arrayed disk drive system 10 receives a request for a read across the VME bus 36. The read request is for n sectors of data, where n=1 to as many sectors of data that are available. The disk controller 24 maps the logical sectors to physical sectors and determines that these sectors belong to redundancy groups. A redundancy group is a group of data sectors and their corresponding p or p and q redundancy blocks.

For each redundancy group, the disk controller 24 reserves an ECC channel (there are sixteen channels which can each perform redundancy in the ECC engine 22) and then reads all sectors in the redundancy group across the data bus 20. The ECC engine calculates both the p and q syndrome values from the data it reads as that data streams across the data bus 20. The requested data is written to a reserved memory location in the processor memory 42, controlled by the disk controller 24. The other sectors' data, not requested for the read, but part of the redundancy group, are discarded after being streamed past the ECC engine 22. Streaming the data past the ECC engine 22 allows the ECC engine to recalculate the p syndrome.

Next, the disk controller 24 queries the ECC engine 22 to determine if the p (and q if there are two redundancy drives) syndromes are nonzero. Using the syndrome status and known errors reported from the SCSI channel controller 18, the disk controller 24 determines an appropriate error status and takes the necessary steps to deal with the error. These steps vary depending on the type of error and the levels of redundancy available to the disk controller 24.

ONE KNOWN DATA SECTOR ERROR AND P REDUNDANCY

When an error occurs in a read it is usually the SCSI channel controller 18 saysing that it cannot read the specified sector on one of its disk drives 14. At that point, it would not be possible for the channel controller 18 to transmit the data in the sector in error because it was unable to read it (the event which triggered the error status). A determination is then made as to whether the sector in error is a data sector which was requested by the read, as opposed to being a sector which was only accessed because it is a member of the overall redundancy group. If the error was not in the sector requested in the read, then it is known that the data sector requested for the read must be correct. The error is then reported to maintenance process, the channel in the ECC engine 22 being used to process the redundancy is freed (to be re-initialized), and the data transfer continues.

If, on the ohter hand, the sector in error is a requested sector, then the disk controller 24 looks to the ECC engine 22 for the corrected data. As discussed above, the p redundancy automatically regenerates data from a lost sector (which is requested in a read) and stores it in the p buffer 62. The disk controller 24 then copies the data from the p buffer 62 to the memory location allocated for the requested sector. The particular ECC channel used to regenerate the data is freed and the data transfer continues. Note, that if the one known error is in the p redundancy sector then the data in the requested sector must be correct. Therefore, it is sent to the host 32 while the maintenance process is notified of the error in the redundancy sector. The maintenance process can alert the host to the bad disk sector and identity its location for replacement. That compeltes a read with one known error and p redundancy. One known error with p and q redundancy, where the p redundancy has gone bad will now be described.

ONE KNOWN DATA SECTOR ERROR AND G REDUNDANCY (P REDUNDANCY BAD)

A determination is made as to whether the known error is in a requested sector. If the known error is in a requested sector, then using the q buffer 66 and the redundancy group's disk number (provided by the SCSI channel controller 18), the disk controller 24 can calculate the correct dat. The corrected sector is then written to a microprocessor memory 42 location allocated for the unreadable sector. Next, the steps to be taken when there are two known errors and p and q redundancy provided are discussed.

TWO KNOWN DATA SECTOR ERRORS AND P AND Q REDUNDANCY

The correction scheme discussed immediately above is similar to the case of two known data sector errors, detected by the SCSI channel controllers 18, when two levels of redundancy are provided, both p and q. If the sectors in error are requested sectors, then using the p buffer 62 and the q buffer 66 and the redundancy group's disk number (as denoted by the SCSI channel controllers 18), the disk controller 24 can calculate the correct data for one of the unreadable sectors. The process of correcting one error, of two, with two levels of error correction is complex, but well known. The disk controller 24 then sends the corrected data for the first sector in error across the data bus 20 to the location allocated, for that sector in microprocessor memory. After the data has streamed down the data bus past the ECC engine, a condition of only one known error remains. This condition is resolved in the same manner as described above when there is one known error and p redundancy. The p redundancy function automatically recreates the lost sector data and places it in the p buffer in DPRAM 62. The disk controller 24 then copies the contents of the p buffer 62 which is the correct data for the second unreadable sector and writes it to the buffer location allocated for the second unreadable sector in the microprocessor memory 42. The ECC channel is then freed and the transfer continues. Next, a description is given of the steps that are taken when there is noe unknown error and p and q redundancy are provided.

ONE UNKNOWN DATA SECTOR ERROR AND P AND Q REDUNDANCY

An unknown error is deemed to have occurred when the SCSI channel controller 18 does not designate a bad sector (flag a misread (or write fail) from a disk sector), but the p or q redundancy syndromes are nonzero. In this situation, the identity of the bad sector is unknown. If both the p and q syndromes are nonzero, then using the values of the p and q redundancy sector, the identity of the bad sector can be calculated by the disk controller 24. Once identified, a condition of one known erro and p redundancy exist. The disk controller 24 reinitializes the p buffer 62 and q buffer 66 and rereads all but the now known bad sector, streaming all the sectors, except the bad one, past the ECC engine 22. The p redundancy function in the ECC engine 22 automatically calculates the missing sectors worth of data and stores it in the p buffer 62. The disk controller 24 then copies the unreadable sectors data from the p buffer 62 into the buffer allocated for this sector (in the microprocessor memory 42). After reading the buffer across the ECC engine 22 the q syndrome should be zero. This verifies the correction has succeeded. The ECC channels used during this redundancy operation are then freed and the data transfer continues.

WRITE OPERATIONS WITH VARIOus ERROR CONDITIONS

Similarly, the ECC software housed in the disk controller 24 performs redundancy during write operations. An example of a write, from the perspective of software, is as follows. The arrayed disk drive system 10 receives a request for a write from the computer 32. The write request is for n sectors. Upon receipt of the request, the disk controller 24 maps the logical sectors to physical sectors and determines whether these sectors are members of a redundancy group. A redundancy group includes all the sectors of data for which a single sector of p or q redundancy data is generated, including the respective p or q sector. If they are members of a redundancy group, calculating p and q redundancy can be accomplished in a variety of ways, depending on the type of error and the redundancy schemes available. Regardless, the ECC engine 22 needs to know the disk identification of the disks in a redundancy group to calculate the q redundancy. That is because the disk identification denotes the distinct constant multiplied to the data. It is necessary to know this constant so it can be divided away to produce the original data. In all cases, one of the ECC channelsis reserved and initialized for the redundancy process.

A write request may only require writing some, but not all of the data sectors of a redundancy group. In this case, all but the sectors to be written are read from the disk drives 14 and added to the p and q buffers 62 and 66 (to complete the redundancy group). If only the first of three sectors, following the example above, was going to be written to, the other two would be read from disk so they could be combined with the incoming sector to produce a new p or p and redundancy sector(s). Continuing on, the requested sectors are then written to their destination disk drive and added to the p and q buffers 62 and 66. Once the p and q redundancy sectors are calculated they are written to their appropriate disk drive locations. That completes the general example of a write operation.

Another write operation scenario arises when all the sectors of a redundancy group are going to be written to the disk drive array 12. The p and q redundancy information is calculated as the data streams by the ECC engine 22 on it way to SCSI channel controller 18. The ECC engine then creates p and q redundancy sector for the redundancy group, and stores the results in the buffers 62 and 66, respectively. The redundancy sectors are then written to their appropriate disk drive locations.

Errors may be detected during a write. If an error is detected, the maintenance process is notified. If the error is not recoverable by virtue of the redundancy group, then a write fail will be sent back to the host computer 32.

Note that for both reads and writes, to calculate redundancy, the ECC engine 22 must know the ECC channel associated with the data as it streams by. Therefore, headers are provided for each block. The headers designate to which transaction the particular block streaming by is a part. Also, to calculate q redundancy, the ECC engine 22 must known the disk within the redundancy group associated with the data. This knowledge is provided by a configuration file of the arrayed disk drive system which is continually checked by the ECC software. The ECC software may access the configuration file and pass information along to the ECC hardware as it determines appropriate. The configuration file provides the logical to physical memory mapping and the redundancy group mapping. When no error occurs during a write, the main process block in the disk controller 24, HTASK (which is described below), will allocate and deallocate ECC channels as the data transfer begins and is completed. HTASK also checks the values of the p and q redundancy syndromes to determine if an error has occurred.

In error cases, the HTASK determines if there is an error and locates it (if possible) by checking the status returned from the SCSI channel controller 18 and by checking the p and q syndromes (nonzero indicating an error). HTASK makes the decision the invoke the ECC software/hardware to identify and correct the error (if possible). Also, HTASK will log errors to the maintenance process.

In general, it takes one redundancy drive to correct one known error. It takes two redundancy drives to determine one unknown error and correct it. It also takes two redundancy drives to correct two known errors. These principles are well known. Also, these are the only actions possible in a system with one or two redundancy drives. Only in these cases will HTASK invoke the ECC software/hardware which provides redundancy.

DISK CONTROLLER SOFTWARE

Referring to FIG. 4, a process connectivity diagram is shown for the software which is run by the disk controller 24. The process connectivity diagram is comprised of process and data blocks. The behavior of the software can be described as a set of asynchronous, concurrent, and interacting processes, where a process, as identified by the process blocks, is loosely defined as an identifiable sequence of related actions. A process is identified with a computation of a single execution of a program. A process can be in one of three states: (1) busy or executing, (2) idle but ready to begin execution, and (3) idle while execution is temporarily suspended. Much of the interaction between processes in a computer results from sharing system resources. Execution of a process is suspended if a resource it requires has been preempted by other processes.

The existence of many concurrent processes in a computer system requires the presence of an entity that exercises overall control, supervises the allocation of system resources, schedules operations, prevents interference between different programs, etc. The term for this entity is an operating system. An operating system is generally a complex program, although some of its functions may be implemented in hardware. In the preferred embodiment the operating system is primarily software.

A significant aspect of the arrayed disk drive system 10 is the use of an operating system on the microprocessor 25. This enables the disk controller 24 to have much greater flexibility in processing because it manages the separate processes so they can function independently. Both transaction speed and the number of transactions completed is increased thereby.

The HISR process block 72 is the host computer 32 interrupt service routine process. The HISR process 72 does all the handshaking with the host. The HISR send input/output parameter blocks (IOPB) 74 from the host to the HTASK along with some control signals. The HTASK process block 76 is the primary process block. It handles all input/output (write/read) requests from the host 32. It is also responsible for: (1) implementing variable redundancy schemes, (2) striping blocks of data in 512, 1024, etc. block distributions, (3) mapping logical disk memory to the physical disk drives 14, (4) performing the redundancy operation, queuing excess IOPBs, (5) acdessing spare disk drives 15, and (6) allocating microprocessor memory 42 to resemble a physical sector when that physical sector is removed or defective, etc.

During a read of write operation HTASK 76 creates a transaction record 78 (TREC). The transaction record is comprised of a plurality of SRECs (SCSI records) which are also created by the HTASK process. The SRECs are the records for each of the transfers of data sectors which make up a transaction. During the same transaction, all of the 512 blocks or sectors of data will receive the same transaction number. For example, with eight data drives and a strip for maximum performance, the smallest piece of data the host 32 can send or receive from the arrayed disk drive 10 is four kilobytes, i.e., 512×8=4 Kbytes. That large block or chunk of data is broken down in to 512 blocks for transfer to and from the disk drives. The size of the smallest piece of data transfer can change based on the number of drives available. Basically, the number of drives available times the 512 byte block equals the smallest piece of data the host can send. Of course, this is assuming a strip one disk drive 14 per channel 18.

Therefore, each of these 512 sector blocks must be identified as part of the correct transaction. Note, although data is transferred to the disk array 12 in blocks of 512 bytes, blocks of 1024, or another multiple or 512 could be used. HTASK can tell when a write operation is complete by monitoring the number of block transfers of a specific transaction number. When all of the blocks of the same transaction number have been written to disk the write is complete. Similarly, when the ECC engine has received the last block of data of a particular write transaction it can write the result of the redundancy calculation to disk.

Referring to FIG. 4(a), each TREC 78 is comprised of the corresponding IOPB, a plurality of SCSI records (SREC) 80 (each of which are blocks of data to be written to a particular sector is the disk array 12), and a count 81 of the number of SRECs. Each SREC 80 is sent to an STASK 82 process block. The STASK 82 oversees the writing of data to the SCSI controllers 18 and additionally oversees the reading of data from the SCSI controllers 18. In a write the STACK's send data to the SCSI controllers 18 in the form of a SCSI control block (SCB) 84. Each SCB 84 contains a tag 85 which identifies its transaction number and is pertinent to its destination. The STASK 82 interrupts the SCSI channel controller (SCSI) 86 for the SCSI to receive the SCBs 84. The SCSI channel controllers 86 are responsible for writing data from the channel controller 18 to the individual disks 14, and reading it therefrom. Once at the individual disk 14, the embedded SCSI controller on the disk drive 14 writes the data to or reads it from the appropriate sector. This occurs in block 88.

During a read operation, regardless if it is a read request from the host 32 or a read request to calculate redundancy information, data is retrieved from the individual disk drive sectors by the embedded SCSI (also in block 88). Each block of requested data becomes a SCSI status block (SSB) 90. Each SSB 90 has a tag 91, similar to the tag 85 for the SCB 84. These SSB 90 are sent to the SCSI interrupt service routine process block (SISR) 92. Each SISR 92 receives an SSB 90 from the SCSI 86 upon interrupt. The SISR produces SSB 94 with tag 95. The tag 95 provides the same function as tag 91 does to block 90. The SISR sends the SSB 94 to the corresponding STASK 82. The data is then sent to the HTASK along with any status errors and written over to the host 32 (if a write).

HISR PROCESS

Referring to FIG. 5, the subroutine performed by the HISR 72 is shown in more detail. In step 100 HISR establishes paths to the HTASK processes 76. There is one path per HTASK process 76. The paths are used to start up an HTASK process 76. The process started is arbitrary; whichever HTASK, it just has to be available for processing new requests. The message will be used merely as a mechanism to start the HTASK process 76. A synchronizing variable is provided that the HTASK process 76 hangs on and the first available HTASK will be started when it is needed.

In step 102, the HTASK semaphore is created. The semaphore is a software mechanism to control order of execution. The mechanism of the semaphore is a series of calls. The phrase "downing" a semaphore means to allocate or reserve a particular process or subpart thereof. Conversely, when a semaphore is "upped" the particular process or program it is controlling may be accessed. Semaphores also provide an element of synchronicity.

In step 104 the IOPB structures are initialized. These are a set of structures that are pre-allocated and are put on a chain of available IOPB's. A chain is simply a method of linking structures or data sectors together in an appropriate order. The enable interrupt of step 106 tells the initialization structure that started the process that it is ready to accept interrupts from the host. This requires the main initialization process to enable interrupts when everything is initialized. Step 108 is the beginning of the main loop. It runs forever waiting for interrupts from the host 32. The HISR 72 is woken by an interrupt from the host 32. In step 110 an IOPB is selected from the available list. If mallocs are used, one is allocated if available. A malloc is a way to allocate memory. Memory usually comes in limited amounts. Therefore mallocs are used to allocate the available memory wisely. If mallocs are not allowed and there is no more memory available, then an error status in generated and the information is sent back to the host 32. The return message is not sent from the HISR since it is only an interrupt routine.

In step 112, the IOPB structure is removed from the available list and the data is copied from the host 32 over the VME 36. The fields in the structure (if any) are initialized and structures are added to the end of the chain of pending IOPBs. This step is done without interfering with the HTASK processes 76 removal of entries from this chain. The HTASK does not do interrupts so only the HISR process 72 needs to do the protection. The IOPB entry is added to the end of the chain or queue to assure chronological order.

In step 114, a semaphore is "upped," thereby freeing an available HTASK process to service the next IOPB request. In step 116, the interrupts enabled in step 106 are re-enabled so the next request can be processed. Care is taken to allow for the window that occurs between this step and where the HISR goes back to sleep. If there is a pending interrupt it fires off and the interrupt handle point at step 108 is immediately entered. The step 116 returns to step 108 after re-enabling the interrupts. The IOPB 74 received from the host 32 has now been sent to the HTASK process block 76.

HTASK PROCESS

Referring to FIG. 6, a flowchart of the HTASK process 76 is provided. In step 120, HTASK establishes paths to the STASK process 82. There is one STASK 82 established for each HTASK 76. In step 122, the structures to be used by an HTASK process are setup and initialized. Each HTASK 76 is identical and will be responsible for processing an IOPB request from beginning to end. The number of HTASK processes allocated does not need to be more than 16 since that in the maximum number of requests the ECC engine 22 can handle concurrently (because the ECC engine 22 only has 16 channels). Some requests do not require I/O, but the majority are I/O requests.

In step 124, the SREC structures are allocated or preallocated. There is an SREC structure needed for each STASK request. An IOPB usually requires multiple reads or writes to multiple devices. In this step resources, such as memory, etc., are allocated to cover these instances. For example, there can only be one outstanding operation per channel so it is reasonable to have one SREC setup per channel. The number of SRECs needed is also affected by the logical configuration of the disk array 12. If there are ten disks drives 14 without redundancy and they are configured as 10 logical (separate) disks then only one SREC is needed.

In step 126, the buffers in microprocessor memory 42 are set up for the HTASk process to read or write data. The size of the buffers have to be at least a sector but the actual size depends on the total amount of space available in the processor 25 and the ideal size for communication with the SCSI controllers 18. Next, in step 128, a TREC structure is setup for each request. This is a local allocation and there is one pre HTASK process. The TREC structure contains the information needed to process the request such as the location of the IOPB, buffers and SREC structures. The structure is initialized at this point although it will also be initialized every time a new request is received.

Step 130 begins the main loop of the HTASK process 76. In this step the HTASK process "downs" the HTASK semaphore which was upped in HISR step 114. Downing the semaphore gives HTASK access to the pending IOPB 74. In step 132, the pending IOPB is removed from the top of the pending IOPB queue. In step 134, the fields in the TREC structure for the IOPB request which was taken off the stack, in step 132, are initialized. In step 136, the decision in made as to whether the request is a read request. If it is, the HTASK process enters the read subroutine in FIG. 6(b). If it is not a read, the inquiry is made, is it a write? If it is a write, the process moves to the write subroutine in FIG. 6(b). If it is neither a write or a read an error is noted and sent to the maintenance process.

Referring to FIG. 6(b), the read and write subroutine of the HTASK process 76 are shown. In step 140, in the read subroutine, information for the SREC requests to be made is calculated from a given sector number and logical device (configuration of disk drives). The level of redundancy being used for the specified logical device must also be determined at this point. The appropriated SREC structures are allocated (if necessary) and initialized and sent to the STASK process corresponding to the requested ECC channel.

Next, in step 142 a determination is made as to whether redundancy is requested. If it is, the ECC engine 22 is setup to allow for redundancy checking for whichever level(s) of redundancy requested. Regardless of the outcome of the decision in step 142, the flow reaches step 146. In step 146, the requested redundancy is performed. If errors are encountered, correction will be applied if possible. Any errors are reported correctly and in some instances the maintenance process is informed so it can further investigate the error condition.

After the redundancy has been performed to ensure that the correct data was read out of the disk drives, data is copied to the user data area, from where it is transferred over to the host 32. This copy operation occurs in step 140, and is the completion of the read subroutine.

Referring now to the write subroutine, it begins at step 150. In this step, data is copied from the user data area in the microprocessor memory 42. In step 152, given the sector number and logical device, information is calculated for the SREC command to be made. This step also requires a determination to be made of what level of redundancy is being used for the specified logical device (a configuration a physical disk drives 14). The user data is transferred to the buffer using the appropriate chunk sizes (where the user data in the host 32 is larger than the processor buffer 42. The appropriate SREC structures are allocated (if necessary) and initialized and sent to the STASK corresponding to the requested channel.

Next, a determination is made as to whether redundancy is requested and at what level(s). This determination is made at step 154. If redundancy is requested, it is setup in step 156. Next, in step 158 information is generated in response to the ECC information. If errors are encountered, corrections are applied if possible. Any errors are correctly reported and in some cases the maintenance will be informed so it can do further investigation of error conditions.

Referring to FIG. 6(a), both the read and write subroutines enter step 160. In step 160 the program waits until the transaction is completed. This usually entails the processing of all SRECs of a given transaction. Upon completion of the transaction, step 162 sends a status report back to the host 32. Next, a check is done of allocated resources. An example of an allocated resource would be memory set aside at the beginning of an operation, to be used to complete the operation. If allocated resources are detected in step 164, they are released in step 166. The program then loops around to the starting point of the main HTASK loop with resources free to be reallocated to the next transaction.

STASK/SCSI/SISR PROCESSES

Referring to FIG. 7, in step 168, the STASK 82 waits for an SREC from a corresponding HTASK 76 or an SSB 94 from a corresponding SISR 92. In step 170, STASK make a determination of whether it has an SREC. If it finds an SREC, the SREC is saved on a chain and a tag is generated for it. This operation produces a SCSI control block (SCB) 84. Referring to FIG. 7(b), an SCB 84 actually contains a control data block (CDB) 171 which is data that was transferred as part of the SREC 84. The tag 173 of the SCB 84 is generated by the STASK 82 and provides information to the SCSI 86 (the tag 173 of FIG. 7(b) is the same as tag 85 of FIG. 4). Once the SCB 84 is created it is sent to the corresponding SCSI 86 by step 174. The program then loops back to the beginning of the STASK program.

If, at step 170, an SREC was not discovered, STASK knows it has an SSB 90 by default. This determination is done in step 176. When an SSB 90 is found its tag 95 (of FIG. 4) is matched with the chained SREC. If a match is not found in step 180, an "error" signal is sent to the HTASK and the maintenance unit. If a match is found the process proceeds to step 182. There the SREC matched in the chain is sent, along with status from the SSB to the calling HTASK. The process then returns to its starting point.

Upon completion of the STASK process 82 the next process to assume control is the SCSI process 86. The segment of code which operates the SCSI process is not entirely located on the disk controller 24. Portions are located on the SCSI controllers 18. Referring to FIG. 2, which is an exploded view of the SCSI channel controller 18, the SCSI process code is housed in the microprocessor 50. It provides two layers of communication. The first is between the disk controller (by way of data on the data bus 20 being picked up by the SCSI DMA 53) and the SCSI microprocessor 50. The second is between the microprocessor 50 and the enhanced SCSI processor 58. The second layer translates the data and control signals into SCSI language or format. There is a third layer of communication and that is between the enhanced SCSI processor and the embedded SCSI controller on each of the disk drives 14. When data is sent over from the disk controller 24 to the SCSI channel controller along the data bus 20, it sends the desired channel, drive, and sector number.

Referring now to the process connectivity of FIG. 4, the dashed-line A-A' represents the separation between software housed on the run on the disk controller 24 and software run of the SCSI channel controllers 18. Below the dashed line A-A', but above dashed line B-B' is software run on the SCSI channel controllers (the subject of FIG. 2). The SCSI controller of block 88 is simply the embedded SCSI on each disk drive 14. The SCSI on disk 88 reads and writes from or to the sectors on that disk drive. It communicates with the SCSI channel controller 18 at the enhanced SCSI processor 58 (of FIG. 2). The operation of the SCSI on disk 88 is provided by the manufacturer of the embedded SCSI and is known in the art.

Referring to FIG. 8, a flowchart for the SCSI process 86 is presented. In step 184, the process gets a command from the dual port RAM 54. The dual port RAM is where data is stored as it comes off the data bus 20. The command received also contains SCBs. As the disk drives become available, in step 186, the process either reads from or writes to a particular disk drive depending on whether a read or write was requested. When the read or write is complete, in step 188, the SCSI process sends status to the HTASK in the form of an SSB 90. The SSB 90 may also contain data if a read was requested. That completes the SCSI process block 86 which just loops upon itself continually.

On the receiving end of the SCSI process block 86 is the SCSI interrupt service routine (SISR) process block 92. The flowchart for this process block is displayed in FIG. 9. In step 190 of the SISR process block 92, the process 92 waits for an interrupt from the SCSI process 86. Upon interruption, the SISR process receives the SSB 90 from SCSI process 86. This occurs in step 192. In step 194, the SSB 90 is sent through the corresponding STASK process 82 to the corresponding HTASK process 76. From there data and/or status can be returned to the host 32 and/or redundancy can be performed, in addition to any other features of the arrayed disk drive system 10 desired or configured to be performed.

This completes the description of the individual processes. A better understanding of how the software of the arrayed disk drive system 10 operates can further be obtained from the examples of a read and a write operation, with and without redundancy, which follow.

READ REQUEST WITHOUT REDUNDANCY

Referring to FIG. 10, a flowchart for a read without redundancy is shown. When a read request is received by the HTASK in the form of an IOPB, the logical disk name, the starting sector number, and the number of sectors are present in HTASK. HTASK maps the logical disk name and starting address to the physical disk drive and starting sector. The disk controller 24 makes sure that each process can get a minimum number of SREC structures and buffers to be able to run, even at a less than optimal rate if necessary. FIG. 10 illustrates the program that is used to process a read request from a logical disk drive when the host 32 does not desire redundancy.

Given the starting sector number, step 198 generates the set of disk and physical sector number pairs to be processed for the first set. A set of disk and physical number pairs is all the disk and physical number pairs required to complete the transfer between the host 32 and the arrayed disk drive system 10. In other words, the set consists of the number of pairs it takes to have one request for each physical disk in the array (limited by the number of sectors the user asked for). Since the read is without redundancy checking there is no reason to limit the reads to a single sector. Therefore, in step 200, reads from the SCSI are generated that are chains of requests. If buffering is used, i.e., the microprocessor memory 42 is being used as a buffer opposed to a direct transfer to the host user data area, the size of the read needs to be determined by the amount of buffer available. In step 202, SREC structures are allocated for the set of pairs defined. A structure is a piece of memory having binary numbers that are viewed in a certain way. In this instance the SREC structures contain the addresses of the data in the buffers. If there is not enough SREC structures and/or buffers for all of the sectors of data as many as possible are done and a mark is made for other SREC structures and buffers.

In step 204, an id. of 0 is set to the ECC engine 22 to let it know that it is not going to be used. In step 206, the SREC structures and buffers for the read requests are setup. The SREC structures are sent to the appropriated STASK processes. The next pair of disk and physical sector pairs is generated, in step 208, for each member of the set that had SREC structures. In step 210, the main loop is entered. A decision is made as to whether there are outstanding sectors to be read. If all have been read, the program moves to the end of the read subroutine at step 228, If all have not been read, then a determination is made if there are any outstanding errors. If an error has occurred the maintenance process and HTASK 76 are informed.

If, in step 212, no error is found the program sleeps on a receive waiting for completion of any read requests. This occurs in step 214. Once a completion has been received by HTASK, a determination is made in step 216 as to which request is complete. If an error occurred no more requests are generated. The existing requests are allowed to be completed, unless they can be cancelled. If buffering is being used, step 218 DMAs the data from the buffer to the host 32 and another buffer location is used for the next request. If there are not enough SREC structures for the set of requests than an SREC structure that was freed as a result of step 218 is used for one of the outstanding set members. The requests are then setup in step 220 and sent to the appropriate STASK process. If there are enough SREC structure or the set is complete, however, step 222 generates the next request with the SREC structure and sends it to the appropriate STASK process.

Step 224 generates the next disk and physical sector pair for the next requested entry of the set. In step 226, the sector count is decremented and the subroutine loops around as long as the number of sectors to be read is greater than zero. Then the program goes to step 228, where the SREC and buffer resources are released. In step 230, a status return to the host 32 is generated and that completes the read. The host 32 now has the completed read data and the HTASK process which was handling the read is freed to handle another request.

READ REQUEST WITH REDUNDANCY

A read with redundancy will now be illustrated. Referring to FIG. 11, a flowchart for the read with redundancy program is shown. As in the case of a read without redundancy the logical disk name, starting sector number and number of sectors is received by HTASK. Also, as in FIG. 10, HTASK makes sure that each process can get a minimum number of SREC structures and buffers to be able to run, even at a less than optimal rate. Beginning in step 232 and given the starting sector number, the program generates the set of disk and physical sector number pairs that make up a redundancy block. Sets are marked that are only for redundancy checking as opposed to the ones being read for the host 32. Data being read for the redundancy check is read into the user data area. If buffering, buffers may be used to accomplish this.

In step 234, the sectors in the redundancy block are locked so that no other process will attempt to change the ECC information while it is being read. Therefore, step 234 also provides a process to sleep on waiting for this lock to be removed, i.e., semaphores. A lock is a mechanism which precludes access by any other process. In step 236, an available ECC channel is obtained, or a semaphore is hung on until one becomes available. An appropriate id. is sent to the ECC engine and a ECC channel is initialized. Step 238 allocates the SREC structures and buffers for the set of pairs defined. If there are not enough SREC structures and/or buffers as many as possible are done and the others are marked, to be done. The SREC structures and buffers for the requests are setup in step 240 and the SREC structures sent to the appropriate STASK 76 processes. In step 242, the next disk and physical sector number pair is generated for each member of the set of members that had SREC structures.

The main loop of the read program is then entered. If the number of sectors to be read is greater than zero, and no errors have occurred (step 244 and 246), the program sleeps on a receive waiting for completion of any read requests (step 248). In step 250, a determination is made of which requests are complete. The data is copied from the buffer to the host 32 (step 252). If there were not enough SREC structures for the set of requests, step 254 uses the SREC structure freed in step 252 for one of the outstanding set members. SREC structures for these outstanding members are then setup and sent to the appropriate STASK process. If there were not enough SREC structures or the set is complete then step 256 generates the next request with the SREC structure. In step 258, the sector count is decremented, and the subroutine loops back around until there are no sectors left to be read.

Returning to step 246, a decision was made as to whether an error had occurred in reading the requested data from the disk drives. If an error has occurred the program flows to step 260 where the decision is made, in HTASK, as to whether the error is correctable. If the answer is yes, the flow goes to step 266. If the error is on a sector that the host 32 requested, then the now correct data is copied from the ECC engine 22 to the user data area. The ECC channel is reinitialized (step 268). The requests which are built are then sent to the appropriate STASK processes as SSBs (step 270). The next pair of disk drive and sector number is generated for the read request from the host (step 272). The sector count in decremented in step 274, and the correction subroutine loops around until all of the sectors have been read.

Once all of the sectors for a read request have been read the program moves to step 276. In step 276, the SREC and buffer resources are released. A status return to the host 32 is then generated and the read with redundancy is complete (step 278).

If, in step 260, the error was deemed to be uncorrectable, i.e., in more sector than could be corrected, information is generated about the error and the maintenance process is notified. This operation takes place is step 280. The flow of the program then drops out of the main loop (step 282). This completes the program for a read with redundancy.

PROCESSING A WRITE REQUEST WITHOUT REDUNDANCY

When the arrayed disk drive system 10 entertains a write request, the disk controller 24 receives the logical disk name, the starting sector number, and the number of sectors requested from the host 32. The disk controller 24 makes sure each process can get a minimum number of SREC structures and buffers to be able to run, even at a less than optimal rate. Referring to FIG. 12, the initialization phase of the write without redundancy is very similar to that of the read without redundancy. The program generates the set of disk and physical sector number pairs to be processed, given the starting sector number (step 284). Since there is no redundancy, request can be setup as chains of requests to the SCSI controller 18 (step 286). SREC structures and buffers (if buffering) are allocated for the set of pairs defined (step 288). Lastly, an id. of 0 is sent to the ECC engine 22 to disable it from being used (step 290).

The first difference occurs at step 292. There, the sectors which have an SREC assigned are locked. This is different from a read because at this point in a read cycle, the desired data is still on the disk drive array 12. In step 294, if there is buffering, the data from the host is copied from the user area to the buffers. SREC structures and buffers are setup and sent to the appropriate STASK 82 (step 296). The next disk and physical sector number pair for each member of the set of that had SREC structure (step 298). If there is buffering, the next portion or write data is copied from the user area into the buffer (step 300).

At this point the initialization phase is complete and the write without redundancy enters its main loop. A determination is made, is steps 302 and 304 if there are anymore sectors which have to be written and if any errors have occurred. If there are sectors and no errors the program sleeps on a receive waiting for a write to complete (step 306). A determination is then made as to which request was completed (step 308). Once completed the sectors are unlocked (step 310). If there were not enough SREC structures for the set of requests being processed, the SREC structure from the completed, unlocked sector can be used for one of the outstanding set members. The request is then setup and the SREC structures are sent to the appropriate STASK process (step 312). If there were enough SREC structures or the set is complete the next request is generated with the SREC structures which are then sent to the appropriate STASK process (step 314).

The next disk and physical sector number pair for entry in the current set is then generated (step 316). If buffering is being used, the data from the next write is copied from the user data area into the buffers (step 318). The count of sector waiting to be written is then decremented (step 320) and the subroutine loops around until all of the sectors have been written for a particular write request. When all the sectors have been written for a write request the condition at step 302 fails, there are no more sectors to write, and flow moves to step 322. At this step, the SREC structures and buffers are released. A status return is then generated and sent to the host 32 (step 324). That step completes the write without redundancy operation. This program is substantially similar to the read without redundancy from the standpoint of the disk controller processes, except the flow of data is reverse and provisions must be made accordingly. Having completed the write without redundancy, the focus will now be shifted to writing with redundancy.

WRITE REQUEST WITH REDUNDANCY

As in the previous three data transfer programs above, when processing a write with redundancy, the host 32 sends the disk controller a logical disk name, a starting sector number, and the number of sectors desired to be written. Also, the disk controller 24, makes sure each process can get a minimum number of SREC structures and buffers to be able to run, even at a less than optimal rate.

Referring to FIG. 13(a), the HTASK generates, the set of disk and physical sector number pairs given the logical starting sector number (step 326). The set of disk and physical sector number pairs are all those disk and physical sector number pairs that make up a redundancy block. After generation of the sets of disk and sector pairs, the sectors to be altered by user data are marked and the redundancy scheme that is being used is indicated (step 328). The sectors in the redundancy block are locked so that no other process will attempt to change the ECC information while it is being altered by the write request. A semaphore is used to provide this protection (step 330). Next, an available ECC channel obtained and an appropriate id. is generated to use the channel. The channel is then initialized for the impending data transfer (step 332).

While the channel is initialized, SREC structures and buffers (if needed) are being allocated for the set of pairs defined in step 326 (step 334). With SREC structures allocated the write subroutine commences. In steps 336 and 338, a determination is made as to whether there are more sectors to be written and if an errors has occurred. If there are more sectors and an error has not occurred, then the determination is made, is step 340, whether the subtraction/addition scheme is being used. Redundancy may be maintained by "subtracting" the old data and "adding" new data or by regenerating the redundancy. If the number of disks that are being altered by user data is less than or equal to the number of disks that are not being altered the subtraction/addition scheme is used. Otherwise it is not used. If the subtraction/addition scheme is used, the program flows to step 342.

At step 342, the ECC channel to be used is initialized. The a read request is generated for the redundancy sectors and they are read to a scratch area of the ECC engine 22 (or in buffers) so that the ECC engine is setup with the redundancy group data (step 344). SREC structures and buffers are then setup and the SREC structures are sent to the appropriate STASK processes. These requests are setup so that a return is not obtained until all the requests are done (step 346). Next, in step 348, the program blocks waiting for a request to complete. While there are outstanding request and no errors have occurred (step 354), steps 356 and 358 determine which request are completed and generate other requests if there are not enough SRECs to do all the requests. If an error has occurred in handling the requests the maintenance process is notified (step 360).

At this point there is new redundancy information (correct for the sectors on disk) in the ECC engine 22. Next, the SREC structures and buffers are setup for the data transfer requests and the SREC structures are sent to the appropriate STASK processes (step 362). While there are outstanding sector and no errors have occurred, a determination is made of the request completed and other requests are generated if there were not enough SRECs to do all the requests (steps 364-368). If an error occurs during the transfer, the maintenance process is notified (step 370).

A write request is generated, in step 372, for the redundancy sectors after getting the redundancy sector from the ECC engine 22. SREC structures and buffers are setup for the requests and the SREC structures are sent to the appropriate STASK 82 (step 374). The data in the buffers is then transferred and the program blocks waiting for a request to complete (step 376). If an error occurs in the redundancy sector transfer, then the maintenance process is notified (step 378). At this point, presuming no error in step 378, there is good data on the disk (step 380). In step 381, the sector count is decremented and the subroutine loops around until the sector number is 0. When the number of sectors is zero (step 336), the program then jumps to step 418 where it releases the SREC and buffer resources. Next, in step 420, a status return to the host 32 is generated, thus completing the subtraction/addition redundancy scheme subroutine.

As pointed out above, however, if the number of disks that are being altered by user data is more than the number of disks that are not being altered the subtraction/addition scheme is not used. Generation of the redundancy sector scheme is used instead The generation of the redundancy sector begins at the determination in step 340 of FIG. 13(a). A "no" in step 340 flows to step 382 in FIG. 13(b). Referring to FIG. 13(b), if subtraction/addition is not being used, the first step is to initialize the ECC channel (step 382). A read request is generated for the sectors that are not being altered, not including the redundancy sector(s) (step 384). The data being read is not important so it is read into a scratch area. The SREC structures and buffers (if needed), are setup for the requests and then sent to the appropriate STASK processes (step 386).

The data is read as long as there are outstanding read requests (step 388). In step 390 a determination is made of which requests have completed. In step 392, other requests are generated if there were not enough SRECs to do all the requests. If an error occurred during the read, the maintenance process is notified (step 394). At this point the redundancy information for the data that is not going to be altered is available in the ECC engine 22. SREC structures and buffers are then setup for the write requests (step 396). The SREC structures are sent to the appropriate STASK processes 82 (step 398). While there are outstanding sectors to be transferred (step 400), step 402 determines which requests have completed. If there were not enough SRECs to do all the requests, other requests are generated (step 404). If any error occurred during the write, the maintenance process is notified (step 406).

The desired data has now been written to disk by the write request immediately above. The corresponding redundancy information has to be extracted from the ECC engine 22 and is written to disk (step 408). SREC structures and buffers are setup for the requests and the SREC structures are sent to the appropriate STASK processes. The requests are set up so that a return (message complete) is not obtained until all requests are done (step 410). A receive is blocked on (step 412). If an error occurred in the transfer the maintenance process is notified (step 414). At this point we now have good data and redundancy on the disk. (step 416). The sector count is then decremented at step 417. The generation subroutine loops around until the sector count has been reduced to zero (0). When a zero sector count is obtained, the SREC and buffer resources are released (step 418). Next, a status return to the host is generated (step 420) and that is the end of the write with redundancy.

Note that the HTASK processes are numbered to n, where n is the number of HTASK channels. Each HTASK can send out SREC structures. This m is limited by the number of ECC channels in the ECC engine 22. A transaction record, holds up to m SRECs. If additional SRECs are needed to complete a task, they are assigned a different transaction number.

ADDITIONAL FEATURES OF ARRAYED DISK DRIVE SYSTEM

One additional feature of the arrayed disk drive system 10 is the hot pluggable disc drive. The term hot pluggable disk drive refers to the capability of having disk drives 14 be replaced or reinstalled without any interruption of the arrayed disk drive operation. In other words, a disk drive 14 can be removed and reinstalled or replaced while the system 10 is power up and running under normal conditions. This capability is provided by the pin configuration of the disk drives and software run by the disk controller 24.

First, the most likely time for damage to occur to a disk is when it is inserted. Therefore, caution must be taken that it does not receive voltage before ground, etc. Accordingly, the pin configurations of the disk drives 14 has the longest pin as ground. That way, before any voltage is applied a common ground is established. The next longest pins are the 5 and 12 volt pins. The shortest are the signal pins. When the signal pins are connected to control the TTL logic, the voltages have already been established, thereby minimizing the uncertainties of plugging in a new drive.

The second aspect of the hot pluggable disk drive 14 is the software in the disk controller 24. The software enables the hot pluggable drive to be "smart." For instance, if one level of redundancy is provided, and a disk has gone bad, the software can determine when the replacement disk has been installed and the lost data, recreated by the ECC engine 22 can be written to the new disk. Also, since a level of redundancy is available the ECC engine 22 could continually recreate the lost data for the bad disk drive until it is replaced. The host 32 would not necessarily know that the data from the bad sector was being recreated each time. The maintenance unit, however, would light an indicator light, on the arrayed disk drive system, indicating to the user which disk was bad. The bad disk is replaced and the recreated data is written to the new disk without the host 32 ever knowing a disk was replaced. Thus, the bad disk can logically be written to or read from while it is being replaced (provided at least one level of redundancy exists).

The software can also distinguish when a previously removed disk drive has been reinstalled. In that case, data can be written or read from different disk drives which are installed at the same location at different times. As above this procedure can occur without having to power down the arrayed disk drive system 10 or interrupting the flow of data between it and the host 32.

COLD STANDBY DISK DRIVE AND SPARING

Two feature similar to the hot pluggable drive are the cold standby drive and sparing. The cold standby drive and sparing have two unique features. First, is the physical existence of an extra drive(s) (15 of FIG. 1). Second, is the software which controls and enables the spare drive(s). Sparing occurs when a spare drive 15 which has been continually powered on, with the rest of the disk array 12, is electronically switched to instead of the bad disk. Cold standby drives are those which are not powered on until they are switched to electronically; the electrical is switch also responsible for booting up the spare. The advantage to a cold standby drive is that the mean time between failures (MTBF) has not yet begun.

Depending of the demands of a particular customer, the array 12 may be configured to have spare disk drives located within it. The spares 15 are configured within the configuration of the system. As a normal operating disk drive 14 reaches a certain point of degradation, the sparing or cold standby software can automatically switch the address of the bad disk drive to one of the spare disk drives. The point of degradation is defined by the user. If only one sector is bad and one level of redundancy is available, it may be prudent to allow the ECC engine 22 to recreate the data each time. However, when a certain specific number of sectors or tracks go bad on a particular disk drive the switch to a spare or cold standby then occurs.

If, alternatively, no redundancy has been requested, the spare or cold standby may be switched to at the first instance when the SCSI channel controller 18, or embedded SCSI, cannot process a read or write. Regardless, once the spare 15 has been switched to, the bad disk can be replaced, and then switched back to.

Note that the customer has their own level of sparing mechanisms. The disk controller 24 may return read data or write the data with a status that indicates the operation succeeded, but had to rely on redundancy information. In that case, the user could then do their own level of sparing by reading the sector/track and logically putting it on some other sector/track within the same disk 14 or a disk on the same channel 16. This, however, may require the host 32 to change its codes.

Note that spare drives and cold standby drives can take the logical place of any other disk drive, regardless of physical location in the array or its redundancy group. Additionally, spare drives and cold standby drives 15 can be physically located anywhere in the disk array and are not limited to placement all in the same channel 19 or physical area of the disk drive array 12.

FLEXIBLE CONFIGURATION OF LOGICAL DISK DRIVES AND CYLINDERS

An additional feature of the arrayed disk drive system 10 is the ability to configure each of the logical disk drives to provide different levels of redundancy. For example, the array 12 could be divided into one logical disk drive consisting of 10 physical disk drives 14 (having one level of redundancy, i.e., one disk drive), another two logical drives having 20 physical disk drives each (having two levels of redundancy, i.e., two disk drives each), 5 logical drives of one physical drive each (having zero levels of redundancy), and 6 spare drives (capable of acting as spares for any of the above data groups). This breakdown is only by way of example. The arrayed disk drive system 10 can be configured to have a multitude of logical disk drive, redundancy level, and number of spare drive combinations. Also, it is important to note that the disk drive array is not limited to 66 disk drives. Rather it can have more drives, more channels, etc. Similarly, the number of spares is not limited to six as in FIG. 1. The system may have 10 or 17 or however many as a customer desires.

The arrayed disk drive system 10 is also capable of configuring the cylinders within a disk drive data group to be partitioned between high bandwidth and high transaction rate data transferring. A cylinder is the term used to refer to the same track on a plurality of disks which share a common alignment. If a data group has four disks having 1000 tracks each, then there are 1000 cylinders, four disks deep. These cylinders, for example, could be allocated 0–199 for high bandwidth data transferring, and 200–999 for high transaction rate data transferring.

In addition to cylinder configuration, the arrayed disk drive system 10 provides the flexibility to have synchronous or non-synchronous disks (or, in other words, synchronous or non-synchronous spindles). In a synchronous disk (or spindle) a read/write head comes up to a track at the same time as the other heads come up to the other tracks. The rate and angular position of the heads are always identical. Conversely, non-synchronous disks do not possess these features. Generally, arrays have synchronous disks because they provide maximum performance, and more particularly, the ability to individually access a disk has not been available. The independent operating structure of the arrayed disk drive system 10, with multiple processors, etc., permits operating with disk drives which are or are not synchronous. This is significant because the price of non-synchronous drives is less than synchronous drives.

OPERATING SYSTEM ON DISK CONTROLLER

As stated above, the behavior of the software can be described as a set of asynchronous, concurrent, and interacting processes, where a process is loosely defined as an identifiable sequence of related actions. A process is identified with a computation of a single execution of a program. Much of the interaction between processes in a computer results from sharing system resources. Execution of a process is suspended if a resource it requires has been preempted by other processes.

What enables all of the process blocks to function together is an operating system. The operating system exercises overall control of the processes, supervises the allocation of system resources, schedules operations, prevents interference between different programs, etc. The existence of the operating system is well known in the art. In the preferred embodiment, the operating system is placed the microprocessor 25. The use of an operating system in the disk controller 24 provides a much greater level of flexibility and speed in processing data transfers. For instance, the operating system permits a plurality of HTASK to be performed in parallel. Additionally, the other process blocks are permitted to function contemporaneously. The operating system is used instead of a task dispenser.

QUEUING IN THE DISK CONTROLLER

Normally, when a host talks to a memory it sends one command at a time and waits for the command to be completed. The host sends an acknowledge interrupt and waits for a status back from the host before it sends the next command. The arrayed disk drive system 10 alleviates this problem by placing an IOPB queue in the disk drive controller 24. The queue enables the host 32 to give the arrayed disk drive system 10 as many requests or commands as it would like to. The host 32 sends them to the disk controller 24. When there are more IOPBs than HTASKs to process them, the extra IOPBs are placed in the queue. The host 32 can then go off and do other tasks, as opposed to waiting for a status return.

Status is returned to the host via a status byte is the IOPB. The IOPB can have two responses. The disk controller was successful in completing the transaction. This response can be very complicated, for instance, when a failure occurred and redundancy was used to recreate the data. The other response is that it could not honor the request. The definition of "could not" is dependent on the host or customers needs. When a "could not" response occurs the data is thrown away and another IOPB from the host 32 is sent.

PRIORITIZED DISK REQUESTS

The arrayed disk drive system 10 gives the host 32 the capability to prioritize disk requests. The disk controller 24 acts on two priority bits in the IOPB. The operating system gives the disk controller 24 this capability and the processes carry it out. The priority bits are located in a field (a combination of bits which define a certain function) in one of the IOPB bytes. The priority bits give the host the ability to prioritize its requests with respect to one another. HTASKs create TRECs. Each TREC has the same priority bits as those IOPB received by the HTASK. Since the TREC (transaction record) is seen by all the other processes, the priority is seen by all the other processes. Priority allows a designated transaction to have an upper hand when it arbitrates for the data bus 20, etc.

RETARGETABLE SOFTWARE

The software of the arrayed disk drive system 10 is retargetable. Retargetable means that the software can run on different processors, i.e., the processor can be changed without having to change the software program. This allows the program to be run on different platforms, such as a personal computer or a microprocessor, which are two substantially different hardware structures. This flexibility in processors allows for utilizing upgrades in processors as they come along. It also avails itself to reductions in processor speed or size, when cost is a consideration. The retargetability of the arrayed disk drive system software, which is application software, is provided essentially by two principles.

First, the software is written in a high level language such that it is non-foreign to standard compilers. Second, it is compiled by whichever compiler is designated for the processor it is intended to be run on. The processor dependent functions, noted in source code, may have to be changed. This requires some new code. But it is only about one percent, not the 90 or 100% that would be required without retargetability.

ALGORITHM TO DEFINE CORRECT DISK PLACEMENT

The arrayed disk drive system 10 provides the feature of being able to swap disk drives while the arrayed disk drive is operating. Various scenarios exist for the desirability of this feature. A primary reason is to provide field repair service, i.e., if a disk goes bad, a new one can be swapped into its place and redundancy can replace the data that was on the disk. Also, a situation may arise where a number of people are accessing the arrayed disk drive system and they each have a different disk drive, which they swap in and out depending on whether they are or are not using the system 10. In these situations and others it is important for the disk controller 24 to ascertain if a disk is in the correct disk position. Therefore, an algorithm is provided in the disk controller 24 which determines which disk has been removed and if an inserted disk is in the correct position.

One possible method of doing this is using a date-and-time stamp. The algorithm would create a data and time stamp on the disk drive 14 and its connection. If a disk drive was inserted which did not match, a prompt such as, "do you really want to read or write from this disk" will appear on the host 32 computer screen. Alternatively, serial numbers or codes could be used to accomplish the same task. Also, the algorithm identifies new disks and provides for configuring them logically. Additionally, during a cold boot, the algorithm makes sure every disk is installed properly, flagging the operator if there are any problems.

MAIN PROCESSOR/BUFFERS/MULTIPLE PROCESSORS

The arrayed disk drive system 10 comprised 14 microprocessors. Eleven are in the SCSI channel controllers 18, one each. One is the disk controller microprocessor 25. Two more are designated for maintenance processing, one processing, one in the customer engineering panel 46, and the other in the disk controller 24. Having a substantial number of processors allows for the high bandwidth/high transaction rate trade-off. A problem arises in allowing all those processors to function at once without destructively interfering with each other. The software is configured so that it does not demand cooperation between the processors. They may all function independently. The disk controller microprocessor 25, however, is guaranteed to have every other slot on the common data bus 20.

It should be further apparent to those skilled in the art that various changes in form and details of the invention as shown and described may be made. It is intended that such changes be included within the spirit and scope of the claims appended hereto.

What is claimed is:

1. An arrayed disk drive system for providing memory to a computer comprising:

a plurality of disk drives configured to form an array, said arrayed disk drives coupled to a plurality of channels, each channel accessing a plurality of disk drives, and each of the arrayed disk drives having a plurality of sectors;

disk controlling means, coupled to communicate with the channels, (a) for grouping the disk drives to define one or more logical groups each of which appears to the computer as a single disk drive so that the arrayed disk drives appear to the computer as any conceivable arrangement of disk drives, whereby the arrayed disk drive may appear to the computer as the plurality of disk drives, or as one large disk drive comprised of all the arrayed disk drives, or any combination in between, and (b) for controlling the transfer of data between the computer and the disk drives in accordance with the grouping;

means for providing a plurality of levels of data loss protection on data read or written by the computer to the arrayed disk drives; and means controlled by the disk controlling means for selectively enabling from none to the plurality of levels of data loss protection to operate on data being read or written from the arrayed disk drives.

2. The arrayed disk drive system of claim 1 further including a buffer memory coupled to the disk controlling means, wherein the disk controlling means further comprises:

means for initially transmitting data received from the computer to the buffer memory and dividing the data into a predetermined number of blocks, each block being equal in quantity size to a sector; and striping means for providing said blocks sequentially from one channel to another for storage in the disk drives.

3. The arrayed disk drive system of claim 2 having a common data bus connecting to the plurality of channels wherein the means for providing data loss protection further comprises:

means for performing data loss protection processing as the data propagates along the data bus from or to a channel during a computer read or write operation, wherein provision of data loss protection requires no more additional time than that necessary to complete the read or write operation.

4. The arrayed disk drive system of claim 3 wherein the disk controlling means further comprises:

means for mapping virtual memory locations specified by the computer in a read or write request to the arrayed disk drives, said arrayed disk drives being physical memory locations.

5. The arrayed disk drive system of claim 4 further comprising means for implementing data loss protection when a disk drive from the arrayed disk drives is removed for installing a replacement disk drive so as to provide data corresponding to data in the removed disk drive, whereby replacement of a disk drive is transparent to the computer and no down time is experienced by the computer.

6. The arrayed disk drive system of claim 5 wherein the means for implementing further comprises means for regenerating data for said removed disk drive based upon data contained in other disk drives when data loss protection is provided by said disk controlling means.

7. The arrayed disk drive system of claim 5 further comprising:

a plurality of spare disk drives; and means for configuring any of said spares to be logically identical to a defective or removed disk drive, whereby a spare takes the logical place of a defective or removed disk drive such that data for the defective or removed disk drive is written to the spare disk drive, and data to be read from the defective or removed disk drive is read from the spare drive.

8. The arrayed disk drive system of claim 7 further comprising means for recreating the data of a defective or removed disk drive when data loss protection is provided and storing the recreated data on a spare configured by said spare configuring means.

9. The arrayed disk drive system of claim 8 wherein the disk controlling means further comprises a plurality of process means, said plurality of process means comprising:

a computer interrupt process means for servicing interrupts from and to said computer and functioning as an interface between said computer and said plurality of process means;

a plurality of computer task process means for honoring read and write requests from the computer to and from the arrayed disk drives, whereby the plurality of computer task process means controls writes from the computer to the arrayed disk drives and reads from the arrayed disk drives to the computer, said plurality of computer task process means also enabling said levels of data los protection;

a plurality of channel task process means for initiating the arrayed disk drives to receive write data from the plurality of computer task process means and to initiate the plurality of computer task process means to receive read data from the arrayed disk drives;

a plurality of channel controlling process means for controlling the movement of data from the plurality of computer task process means to each of the plurality of channels during a read, and from each of the plurality of channels to the plurality of computer task process means during a write; and a plurality of channel interrupt process means for processing interrupts to and from each of the plurality of channels.

10. The arrayed disk drive system of claim 9 further comprising an operating system, said plurality of process means being connected to one another by said operating system and functioning thereon, whereby said disk controlling means operates on said operating system.

11. The arrayed disk drive system of claim 10, having input output parameter blocks from said computer, further comprising:

means for queuing said input output parameter blocks, said queuing means operating when there are more input output parameter blocks than the plurality of computer task process means.

12. The arrayed disk drive system of claim 11 wherein the disk controlling means further comprises:

means for providing a priority to each requests from the computer, each of said plurality of process means seeing said priority.

13. The arrayed disk drive system of claim 12 having a processor on which said operating system and said disk controlling means operate, said disk controlling means being comprised of high level computer software, said operating system and said high level computer software combine to make said disk controlling means retargetable on a plurality of processors.

14. The arrayed disk drive system of claim 13 further comprising a means for defining the location of each of the plurality of disk drives in the arrayed disk drives; and means for communicating attempts to place a disk drive in a location other than its defined location.

15. The arrayed disk drive system of claim 14 having a customer engineering means said arrayed disk drive system further comprising a plurality of processors, each of said plurality of channels comprising a processor, said disk controlling means comprising a processor, and said customer engineering means having a plurality of processors, wherein said disk controlling means further comprises means for providing simultaneous operation of said plurality of processors, whereby said arrayed disk system is capable of parallel processing and being configured to provide high bandwidth or high transaction rate processing or any compromise therebetween.

16. An arrayed memory system for providing memory to a host computer, comprising:

a plurality of storage devices configured to form an array, said arrayed storage devices accessed by a plurality of channels, each channel accessing a plurality of storage devices, and;

controlling means separate from the host computer for configuring said plurality of storage devices to appear to the host computer as any arrangement of storage devices, whereby the plurality of storage devices may be configured to appear all as one logical storage device, or as plural logical storage devices equal to the plurality of storage devices, or any configuration therebetween.

17. The arrayed memory system of claim 16 wherein the controlling means further comprises:

means for providing a plurality of levels of data loss protection on data read or written by the computer to the arrayed storage devices; and means controlled by the controlling means for enabling from none to the plurality of levels of data loss protection to operate on data being read or written from the arrayed storage devices.

18. The arrayed disk drive system of claim 17 wherein the disk controlling means further comprises a plurality of process means, said plurality of process means comprising:

a computer interrupt process means for servicing interrupts from and to said computer and functioning as an interface between said computer and said plurality of process means;

a plurality of computer task process means for honoring read and write requests from the computer to and from the arrayed disk drives, whereby the plurality of computer task process means controls reads from the computer to the arrayed disk drives and writes from the arrayed disk drives to the computer, said plurality of computer task process means also enabling said levels of redundancy;

a plurality of channel task process means for initiating the arrayed disk drives to receive read data from the plurality of computer task process means and to initiate the plurality of computer task process means to receive write data from the arrayed disk drives;

a plurality of channel controlling process means for controlling the movement of data from the plurality of computer task process means to each of the plurality of channels during a read, and from each of the plurality of channels to the plurality of computer task process means during a write; and a plurality of channel interrupt process means for processing interrupts to and from each of the plurality of channels.

19. A method for providing memory to a host computer employing an arrayed system having a plurality of storage devices configured to form an array, said arrayed storage devices accessed by a plurality of channels, each channel accessing a plurality of storage devices, comprising the steps of:

- logically grouping the arrayed storage devices to form logical storage devices which appear to the host computer as any conceivable arrangement of storage devices, whereby the arrayed storage devices may appear to the host computer as the plurality of storage devices, or as one large storage device comprised of all the arrayed storage devices, or any combination in between;
- providing a plurality of levels of data loss protection on data read or written by the computer to the arrayed storage devices;
- selectively enabling from none to the plurality of levels of data loss protection to operate on data being read or written from the arrayed storage devices.

20. The method of claim 19 wherein the arrayed system has a common data bus connecting to the plurality of channels and wherein the step of providing data loss protection further comprises the step of:

- performing data loss protection processing as the data propagates along the data bus from or to a channel during a host computer read or write operation, whereby data loss protection requires no more additional time than that necessary to complete the read or write operation.

21. The method of claim 20 wherein the logical grouping step further comprises the step of:

- mapping virtual memory locations designated by the host computer to the arrayed storage devices, said arrayed storage devices being physical memory locations.

22. The method of claim 21 further comprising the step of performing data loss protection processing to provide continuous operation of the arrayed memory system when a storage device from the arrayed storage devices is removed for installing a replacement disk drive, whereby no down time is experienced by the computer.

23. The method of claim 22 wherein the continuous operation providing step further comprises the step of regenerating data for said removed storage device by way of data loss protection processing.

24. The method of claim 22 further comprising the steps of:

- providing a plurality of spare storage devices; and
- configuring said spares to be logically identical to a defective or removed storage device, whereby a spare takes the logical place of a defective or removed storage device such that data for the defective or removed storage device is written to the spare storage device, and data to be read from the defective or removed storage device is read from the spare storage device.

25. The method of claim 24 further comprising the step of providing a plurality of process means, said plurality of process means comprising the steps of:

- providing a computer interrupt process means for servicing interrupts from and to said computer and functioning as an interface between said computer and said plurality of process means;
- providing a plurality of computer task process means for honoring read and write requests from the computer to and from the arrayed storage devices, whereby the plurality of computer task process means controls reads from the computer to the arrayed storage devices and writes from the arrayed storage devices to the computer, said plurality of computer task process means also enabling said levels of redundancy;
- providing a plurality of channel task process means for initiating the arrayed storage devices to receive read data from the plurality of computer task process means and to initiate the plurality of computer task process means to receive write data from the arrayed storage devices;
- providing a plurality of channel controlling process means for controlling the movement of data from the plurality of computer task process means to each of the plurality of channels during a read, and from each of the plurality of channels to the plurality of computer task process means during a write; and
- providing a plurality of channel interrupt process means for processing interrupts to and from each of the plurality of channels.

26. The method of claim 25 further comprising the step of providing an operating system, said plurality of process means being connected to one another by said operating system and functioning thereon.

27. The method of claim 26, having input output parameter blocks from said computer, further comprising the steps of:

- providing queuing means for queuing said input output parameter blocks, said queuing means operating when there are more input output parameter blocks than the plurality of computer task process means.

28. The method of claim 27 wherein the step of controlling movement of data further comprises the step of:

- providing a priority to each request from the computer, each of said plurality of process means seeing said priority.

29. A configurable arrayed disk drive system for providing memory to a host computer, comprising:

- a plurality of disk drives; and
- array control means for selectively defining any combination of one or more logical groups of disk drives in which each group includes at least one disk drive and in which the combination employs up to the plurality of disk drives, and for selectively assigning disk drives from among the plurality to form the logical groups, the array control means including (a) disk drive control processing means coupled to the disk drives to control read/write operations of each disk drive, and (b) system control processing means, coupled to the disk drive control processing means, for receiving read/write requests for any logical group form the host computer and controlling the disk drive control processing means to cause appropriate read/write operations to occur with respect to each disk drive in the logical group for which the request was received, wherein each logical group is accessed by the host computer as if it were a separate single disk drive.

30. A disk drive system as in claim 29 further including data loss protection means for generating parity information for enabling reconstruction of data lost from a disk drive, the parity information being generated based upon data from a parity group which includes two or more disk drives; and wherein the system control processing means selectively enables the data loss protection means for each logical group to provide data loss protection therefor.

31. A disk drive system as in claim 30 wherein the data loss protection means includes means for generating protection data in accordance with a first protection scheme and a second protection scheme, and wherein the system control processing means can selectively enable one or more protection schemes for each logical group.

32. A disk drive system as in claim 30 wherein any logical group of disk drives for which the data loss protection means is enabled includes a plurality of disk drives and the disk drives contained in the logical group store both data from the host computer and protection data generated by the data loss protection means.

33. A disk drive system as in claim 29 further including means for maintaining any disk drive which is not part of a defined logical group as a spare which can be substituted into any logical group to replace a disk drive in the group.

34. A configurable arrayed disk drive system for providing memory to a host computer, comprising:
a plurality of disk drives;
a common bus for transmitting data to and from each of the disk drives;
array control means for selectively configuring at least some of the disk drives into one or more logical groups of at least one disk drive each, for dividing data received from the host computer to be stored in any particular group into designated portions and for providing the designated portions to the common data bus; and
controller means coupled between the common data bus and the disk drives, for recognizing and transmitting each designated portion of data to a particular disk drive for storage.

35. A disk drive system as in claim 34 further including a plurality of channel buses coupled to the common bus, wherein the controller means includes a plurality of channel controllers, one coupled to each channel bus for controlling the transmission of data on the channel buses, and wherein there is at least one disk drive coupled to each channel bus.

36. A disk drive system as in claim 35 wherein there are a plurality of disk drives coupled to each channel bus.

37. A disk drive system as in claim 36 wherein the controller means further includes a plurality of disk drive controllers, one associated with each disk drive, for controlling the transmission of data to each disk drive.

38. A disk drive system as in claim 34 further including data loss protection means, coupled to the common bus, for generating reconstruction data for enabling reconstruction of data lost from a disk drive and wherein the array control means can selectively configure disk drives into at least one data reconstruction group and selectively enable operation of the data loss protection means for each data reconstruction group, wherein each data reconstruction group stores data from the computer and reconstruction data.

39. A disk drive system as in claim 38 wherein each data reconstruction group is formed of a logical group.

40. A disk drive system as in claim 38 wherein the data loss protection means includes first means and second means for generating first reconstruction data and second reconstruction data, respectively, wherein the array control means can selectively enable either one or both of the first and second means with respect to any data reconstruction group.

41. A disk drive system as in claim 38 wherein the array control means can configure the logical groups and data reconstruction groups to include less than all of the disk drives and to maintain disk drives which are not in a logical group as a group of spares which may be substituted into any logical group to replace a failed disk drive.

42. A disk drive system as in claim 37 further including data loss protection means, coupled to the common bus, for generating reconstruction data for enabling reconstruction of data lost from a disk drive and wherein the array control means can selectively configure disk drives into at least one data reconstruction group and selectively enable operation of the data loss protection means for each data reconstruction group, wherein each data reconstruction group stores data from the computer and reconstruction data.

43. A disk drive system as in claim 42 wherein the array control means can configure the disk drives to maintain at least one disk drive outside of any logical group to function as a spare which may be selectively switched into any logical group to replace a failed disk drive.

44. A disk drive system as in claim 43 wherein the array control means configures all disk drives coupled to a particular channel bus as spares.

45. A configurable arrayed disk drive system for providing memory to a computer, comprising:
a common bus for receiving data from the computer and transmitting data to the computer;
a plurality of channel buses coupled to the common bus;
a plurality of channel controllers, one coupled to each channel bus, for controlling the transfer of data between the common bus and the channel buses;
a plurality of disk controllers, one associated with each disk drive, for controlling the transfer of data between the disk drives and the channel buses;
data error correction means, coupled to the common bus, for correcting data errors with respect to specified groups of data; and
array control means coupled to the common bus for selectively configuring the disk drives into logical groups of at least one disk drive each to receive and store related data from the computer, for selectively enabling the data error correction means to be operative with respect to any logical group, for maintaining a plurality of disk drives as spare disk drives for subsequent replacement of a failed disk drive in any logical group, for dividing related data received from the computer into portions for storage in different disk drives of a group specified to store the data and providing the divided data to the common bus for storage in the appropriate disk drives via the channel controllers and disk controllers, and for obtaining previously divided related data from the disk drives and combining it for provision to the computer.

46. A disk drive system as in claim 45 wherein the error correction means includes first means for implementing a first error correction function in which first parity data is calculated with respect to data from the computer to be stored in a specified group of disk drives, wherein the calculated parity data is stored in the group along with the data from the computer.

47. A disk drive system as in claim 46 wherein for any group of disk drives for which the first means of the error correction means is enabled, space equal to the storage capacity of one disk drive is allocated for storage of first parity data.

48. A disk drive system as in claim 46 wherein the error correction means includes second means for implementing a second error correction function in which second parity data is calculated with respect to data from the computer to be stored in a specified group of disk drives, wherein the calculated second parity data is stored in the group along with the data from the computer, wherein the array control means can selectively enable either or both of the first and second means.

49. A disk drive system as in claim 48 wherein for any group of disk drives for which the first means or second means of the error correction means is enabled, space equal to the storage capacity of one disk drive is allocated for storage of first or second parity data generated by the first or second means, respectively.

50. A disk drive system as in claim 29 wherein the array control means includes a common data bus coupled to the system control processing means and the disk drive control processing means for providing communication therebetween.

51. A disk drive system as in claim 50 wherein there are a plurality of disk drive channels, each having at least one disk drive, and wherein the disk drive control processing means is comprised of a plurality of channel processing means provided separately for each disk drive channel.

52. A disk drive system as in claim 34 wherein data from the host computer is written to the disk drive system and data stored in the disk drive system is read to the host computer and wherein the host computer provides a read/write request for any logical group as if the logical group were a single physical disk drive when a read/write operation is desired, wherein:

the array control means includes system control processing means for receiving and analyzing read/write requests from the host computer to determine which disk drives any particular read/write request pertains to and for controlling the controller means to cause reading from or writing to the appropriate disk drives in order to execute the request.

53. A disk drive system as in claim 52 including means for coupling the host computer to the common bus, wherein read/write requests and data are transmitted on the common bus.

54. A disk drive system as in claim 52 wherein the array control means includes a memory means for receiving and temporarily storing data from the host computer for subsequent division into designated portions to be transferred to the disk drives and for receiving and temporarily storing designated portions from the disk drives for subsequent grouping into data to be transferred to the host computer as a single group, wherein the system control processing means controls the division into designated portions and grouping of designated portions.

55. A disk drive system as in claim 34 wherein the array control means includes means for retrieving related designated portions of data which were previously stored in the disk drives, combining the designated portions of data into a group and providing the combined data to the common bus for transfer to the host computer.

56. A configurable arrayed storage device system for providing memory to a host computer, comprising:
a plurality of storage devices; and
array control means for selectively defining any combination of one or more logical groups of storage devices in which each group includes at least one storage device and in which the combination employs up to the plurality of storage devices, and for selectively assigning storage devices from among the plurality to form the logical groups, the array control means including (a) storage device control processing means coupled to the storage devices to control read/write operations of each storage device, and (b) system control processing means, coupled to the storage device control processing means, for receiving read/write requests for any logical group from the host computer and controlling the storage device control processing means to cause appropriate read/write operations to occur with respect to each storage device in the logical group for which the request was received, wherein each logical group is accessed by the host computer as if it were a separate single storage device.

57. A configurable arrayed storage device system for providing memory to a host computer, comprising:
a plurality of storage devices;
a common bus for transmitting data to and from each of the storage devices;
array control means for selectively configuring at least some of the storage devices into one or more logical groups of at least one storage device each, for dividing data received from the host computer to be stored in any particular group into designated portions and for providing the designated portions to the common data bus; and
controller means coupled between the common data bus and the storage devices, for recognizing and transmitting each designated portion of data to a particular storage device for storage.

* * * * *

UNITED STATES PATENT AND TRADEMARK OFFICE
CERTIFICATE OF CORRECTION

PATENT NO. : 5,148,432                                      Page 1 of 2
DATED       : September 15, 1992
INVENTOR(S) : Gordon, et al It is certified that error appears in the above-indentified patent and that said Letters Patent is hereby corrected as shown below:

In column 2, line 17, after observed add -- . --.
In column 4, line 49, delete "ahs" and insert -- has --.
In column 7, line 61, please delete "fire" and insert -- Fire --.
In column 8, line 7, please delete "tne" and insert -- the --.
In column 8, line 20, please delete "Calif." and insert -- California --.
In column 8, line 29, please delete "seconc" and insert -- second --.
In column 8, line 33, please delete "conrroller" and insert -- controller --.
In column 8, line 42, please delete "ror" and insert -- for --.
In column 8, line 52, please delete "tne" and insert -- the --.
In column 9, line 9, please delete "controlled" and insert -- controller --.
In column 9, line 26, please delete "level" and insert -- levels --.
In column 10, lines 10 and 11, please delete "conrroller" and insert -- controller --.
In column 10, line 39, please delete "contro ler" and insert -- controller --.
In column 10, line 42, please delete "Tne" and insert -- The --.
In column 11, line 25, please delete "tne" and insert -- the --.
In column 11, line 37, please delete "exolusive-" and insert -- exclusive- --.

UNITED STATES PATENT AND TRADEMARK OFFICE
CERTIFICATE OF CORRECTION

PATENT NO. : 5,148,432
DATED : September 15, 1992
INVENTOR(S) : Gordon, et al

It is certified that error appears in the above-indentified patent and that said Letters Patent is hereby corrected as shown below:

In column 12, line 1, please delete "11" and add -- all --.
In column 12, line 20, please delete "oe" and insert -- be --.
In column 12, line 53, please delete "," after 42.
In column 13, line 5, please delete "saysing" and insert -- saying --.
In column 13, line 21, please delete "ohter" and insert -- other --.
In column 13, line 36, please delete "compeltes" and insert -- completes --.
In column 13, line 40, please delete "G" and insert -- Q --.
In column 14, line 14, please delete "noe" and insert -- one --.
In column 14, line 27, please delete "erro" and insert -- error --.
In column 14, line 67, after "channels" please add a space In column 15, line 37, please delete "known" and insert -- know --.
In column 16, line 48, please delete "acdessing" and insert -- accessing --.
In column 20, line 12, after "maintenance" insert -- process --.
In column 33, line 19, in claim 9, please delete "los" and insert -- loss --.

Signed and Sealed this

Second Day of November, 1993

*Attest:*

*Attesting Officer*

BRUCE LEHMAN
*Commissioner of Patents and Trademarks*